United States Patent
Lin et al.

(10) Patent No.: US 12,520,520 B2
(45) Date of Patent: Jan. 6, 2026

(54) ISOLATION STRUCTURE FOR ISOLATING SOURCE/DRAIN REGION STRUCTURE FROM ADJACENT SOURCE/DRAIN STRUCTURE

(71) Applicant: Taiwan Semiconductor Manufacturing Company, Ltd., Hsin-Chu (TW)

(72) Inventors: Ta-Chun Lin, Hsinchu (TW); Kuan-Lin Yeh, Hsinchu (TW); Chun-Jun Lin, Hsinchu (TW); Kuo-Hua Pan, Hsinchu (TW); Mu-Chi Chiang, Hsinchu (TW); Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 18/669,059

(22) Filed: May 20, 2024

(65) Prior Publication Data
US 2024/0313072 A1  Sep. 19, 2024

Related U.S. Application Data

(63) Continuation of application No. 17/826,816, filed on May 27, 2022, now Pat. No. 11,990,525, which is a continuation of application No. 17/033,031, filed on Sep. 25, 2020, now Pat. No. 11,349,002.

(51) Int. Cl.
| | |
|---|---|
| *H10D 30/62* | (2025.01) |
| *H10D 62/10* | (2025.01) |
| *H10D 62/13* | (2025.01) |

(52) U.S. Cl.
CPC ........ *H10D 30/6219* (2025.01); *H10D 30/62* (2025.01); *H10D 62/116* (2025.01); *H10D 62/151* (2025.01)

(58) Field of Classification Search
CPC .. H10D 30/62; H10D 30/6219; H10D 62/116; H10D 62/151; H10D 30/6735; H10D 84/0151; H10D 84/0188
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,796,666 B1 | 8/2014 | Huang et al. |

(Continued)

*Primary Examiner* — Changhyun Yi
(74) *Attorney, Agent, or Firm* — Cooper Legal Group, LLC

(57) ABSTRACT

A first source/drain structure is disposed over a substrate. A second source/drain structure is disposed over the substrate. An isolation structure is disposed between the first source/drain structure and the second source/drain structure. The first source/drain structure and a first sidewall of the isolation structure form a first interface that is substantially linear. The second source/drain structure and a second sidewall of the isolation structure form a second interface that is substantially linear. A first source/drain contact surrounds the first source/drain structure in multiple directions. A second source/drain contact surrounds the second source/drain structure in multiple directions. The isolation structure is disposed between the first source/drain contact and the second source/drain contact.

20 Claims, 27 Drawing Sheets

(56) References Cited

U.S. PATENT DOCUMENTS

| | | |
|---|---|---|
| 8,815,712 B2 | 8/2014 | Wan et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2015/0035023 A1* | 2/2015 | Kim .................. H10D 84/038 257/288 |
| 2016/0284700 A1* | 9/2016 | Yoon .................. H01L 27/1211 |
| 2018/0151564 A1* | 5/2018 | Lee .................... H10D 64/017 |
| 2018/0151683 A1* | 5/2018 | Yeo .................... H10D 84/853 |
| 2018/0233505 A1* | 8/2018 | Mulfinger ......... H01L 21/02532 |
| 2019/0181257 A1 | 6/2019 | Jeong et al. |
| 2019/0295898 A1 | 9/2019 | Xie et al. |
| 2020/0027992 A1 | 1/2020 | Jung et al. |
| 2020/0119180 A1 | 4/2020 | Frougier et al. |

\* cited by examiner

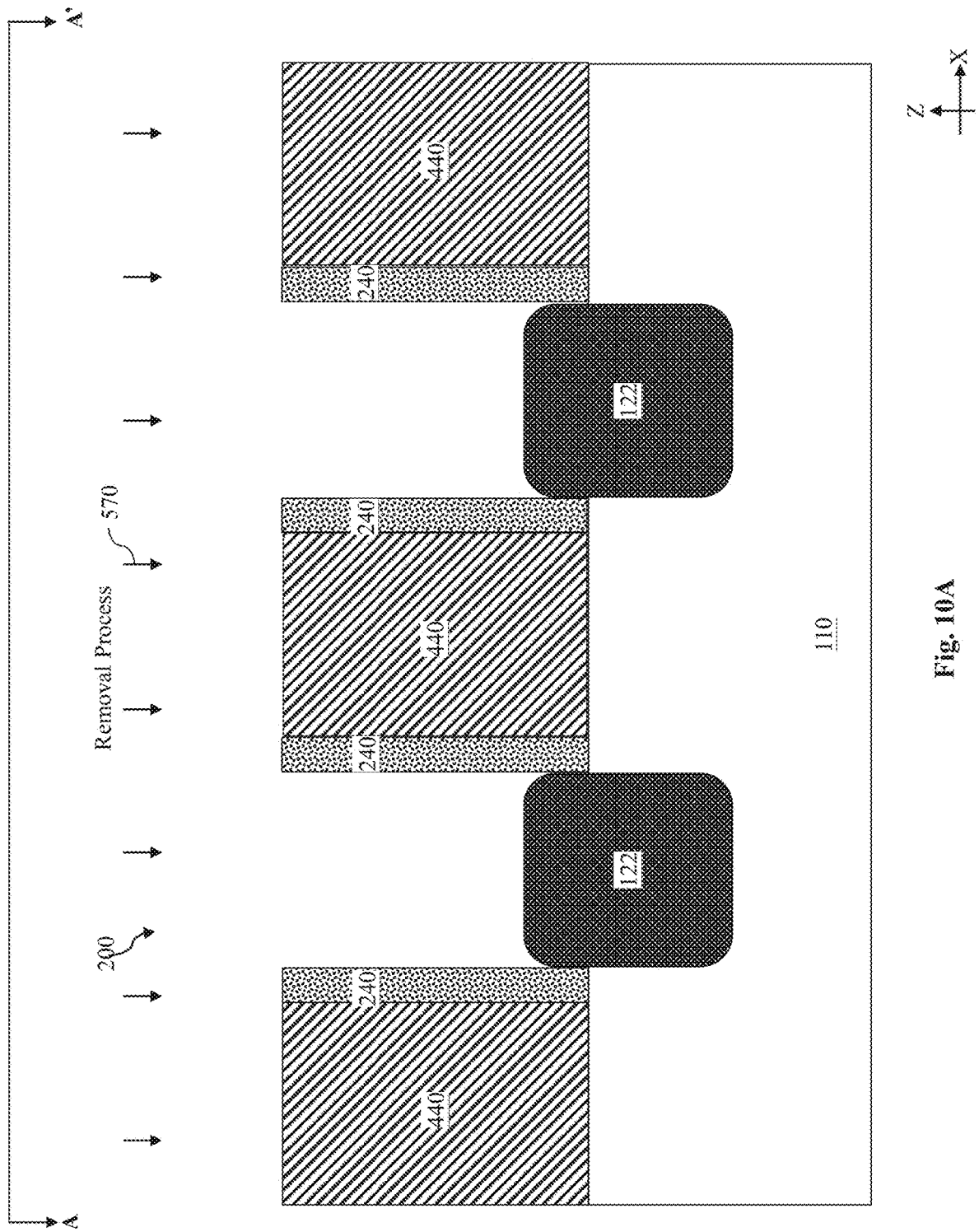

ISOLATION STRUCTURE FOR ISOLATING SOURCE/DRAIN REGION STRUCTURE FROM ADJACENT SOURCE/DRAIN STRUCTURE

RELATED APPLICATIONS

The present application is a continuation of U.S. patent application Ser. No. 17/826,816 filed on May 27, 2022, "Isolation Structure For Isolating Epitaxially Grown Source/Drain Regions And Method Of Fabrication Thereof", which is a continuation application of U.S. patent application Ser. No. 17/033,031 filed on Sep. 25, 2020, entitled "Isolation Structure for Isolating Epitaxially Grown Source/Drain Regions And Method Of Fabrication Thereof", issued on May 31, 2022 as U.S. Pat. No. 11,349,002, the disclosures of each which are hereby incorporated by reference in their entireties. The present application is also related to U.S. patent application Ser. No. 16/917,778, filed on Jun. 30, 2020, entitled "Isolation Structure For Preventing Unintentional Merging of Epitaxially Grown Source/Drain", the disclosures of each which is hereby incorporated by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices continue to get scaled down, the space between adjacent transistors becomes smaller and smaller. The small spacing may cause the epitaxial source/drain features between adjacent transistors to merge into one another, which leads to electrical shorting between the adjacent transistors. Electrical shorting is undesirable because it may degrade device performance or even cause device failures.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, and 12A and 2B, 3B, 4B, 5B, 6B, 7B, 8B, 9B, 10B, 11B, and 12B are cross-sectional side views of various embodiments of IC devices at various stages of fabrication according to various aspects of the present disclosure.

DETAILED DESCRIPTION

Figure 1A:
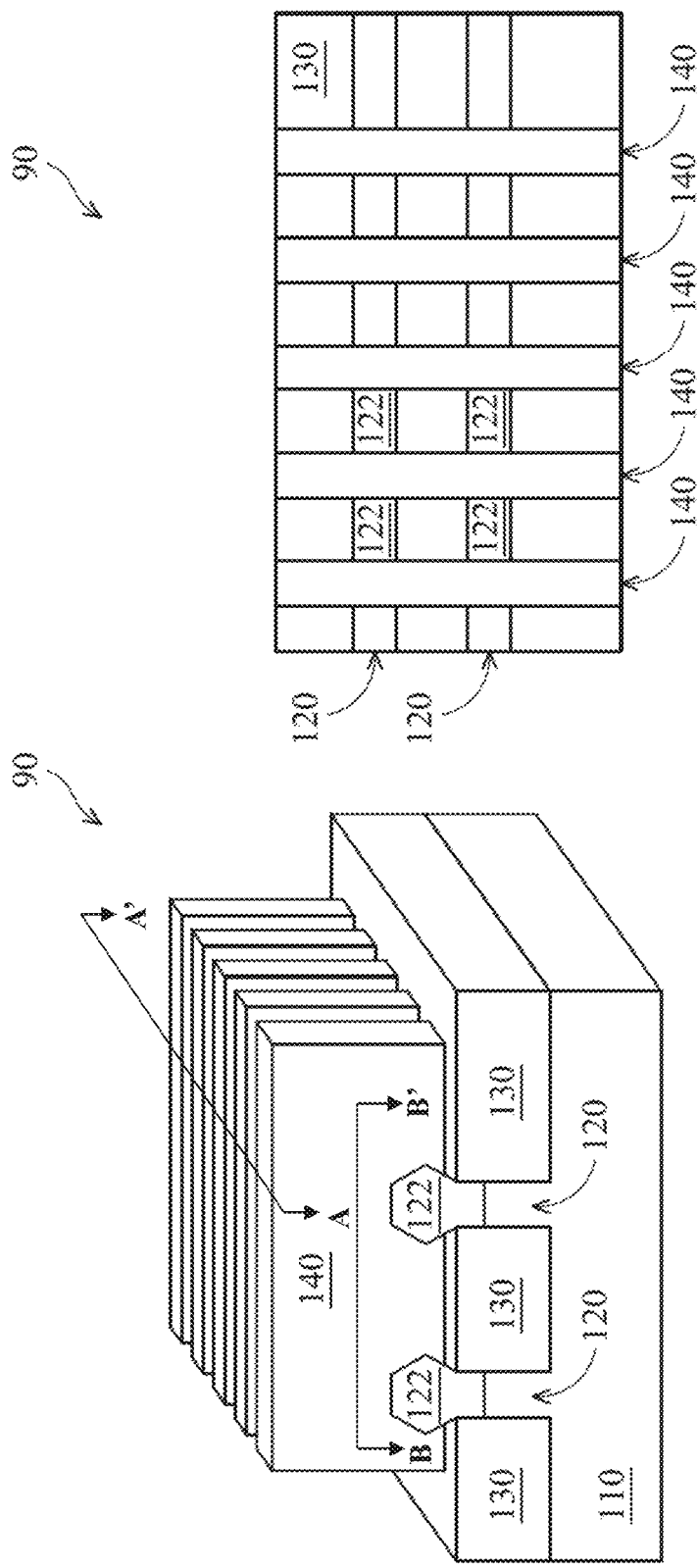
FIG. 1A is a perspective view of an IC device in the form of a FinFET according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs, three-dimensional fin-line FETs (FinFETs), or gate-all-around (GAA) devices. One aspect of the present disclosure involves forming isolation structures to electrically isolate the epitaxially grown source/ drain components from adjacent transistors. As a result, device yield, reliability, and/or performance may be improved, as discussed below in more detail.

Figure 1B:
FIG. 1B is a planar top view of an IC device in the form of a FinFET according to various aspects of the present disclosure.

FIGS. 1A and 1B illustrate a three-dimensional perspective view and a top view, respectively, of a portion of an Integrated Circuit (IC) device 90. The IC device 90 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed. For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. As device sizes continue to shrink, these source/drain features 122 may merge into one another even when they are meant to be kept separate. This is the problem that the present disclosure overcomes, as discussed below in more detail.

The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

Figure 1C:
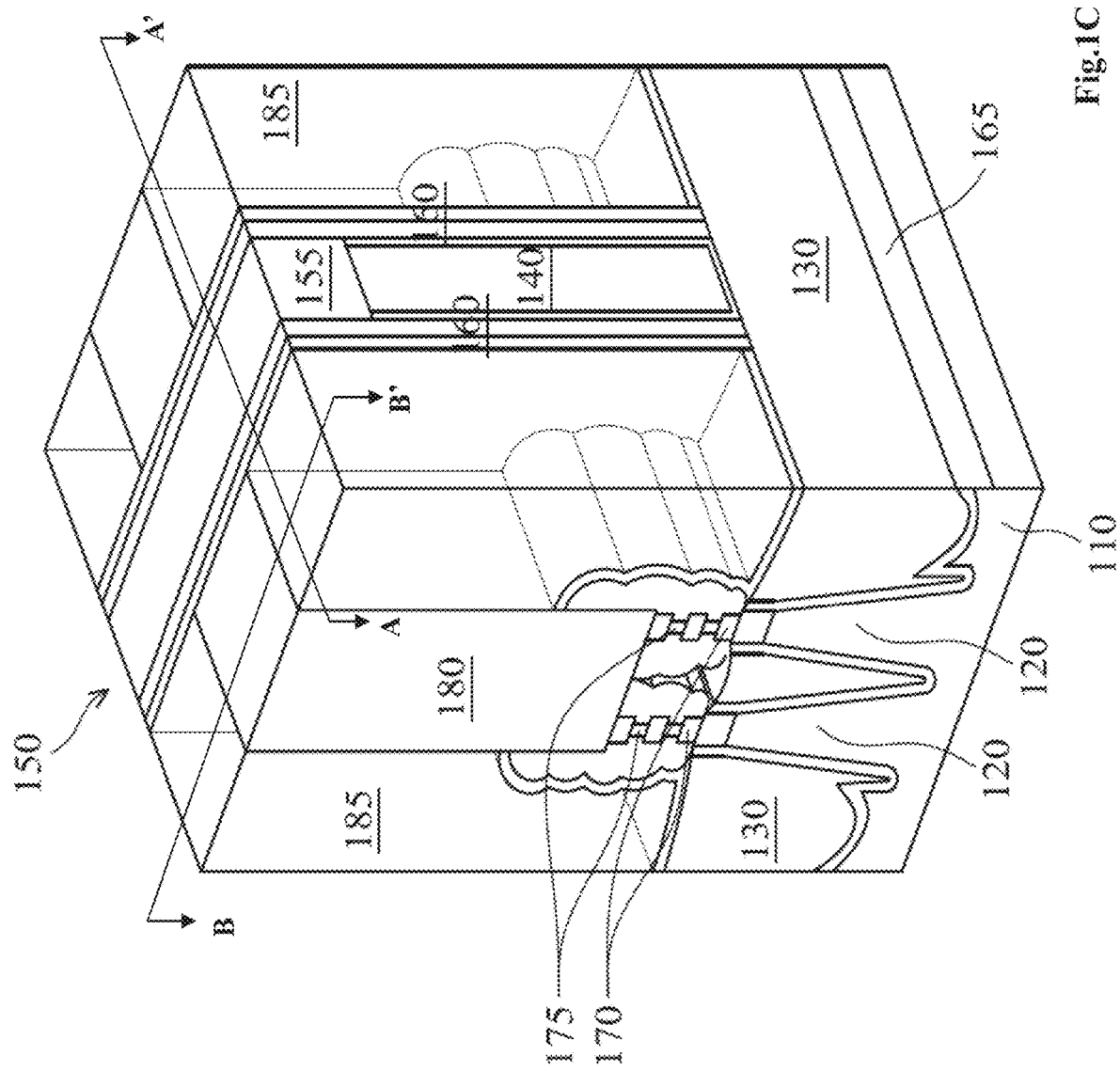
FIG. 1C is a perspective view of an IC device in the form of a GAA device according to various aspects of the present disclosure.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120.

The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, and also in U.S. Pat. No. 9,887,269, titled "Multi-Gate Device and Method of Fabrication Thereof" and issued on Feb. 6, 2018, the disclosures of each which are hereby incorporated by reference in their respective entireties. To the extent that the present disclosure refers to a fin structure or FinFET devices, such discussions may apply equally to the GAA devices.

FIGS. 2A-12A and 2B-12B illustrate the cross-sectional side views of an IC device 200 at different stages of fabrication. FIGS. 2A-12A correspond to the cross-sectional cuts taken along an X-direction, for example along the cutline A-A' in FIG. 1A. As such, FIGS. 2A-12A may be referred to as X-cut Figures. FIGS. 2B-12B correspond to the cross-sectional cuts taken along an Y-direction, for example along the cutline B-B' in FIG. 1A. As such, FIGS. 2B-12B may be referred to as Y-cut Figures. For reasons of consistency and clarity, similar components appearing in FIGS. 2A-12A and 2B-12B will be labeled the same.

Figure 2A:
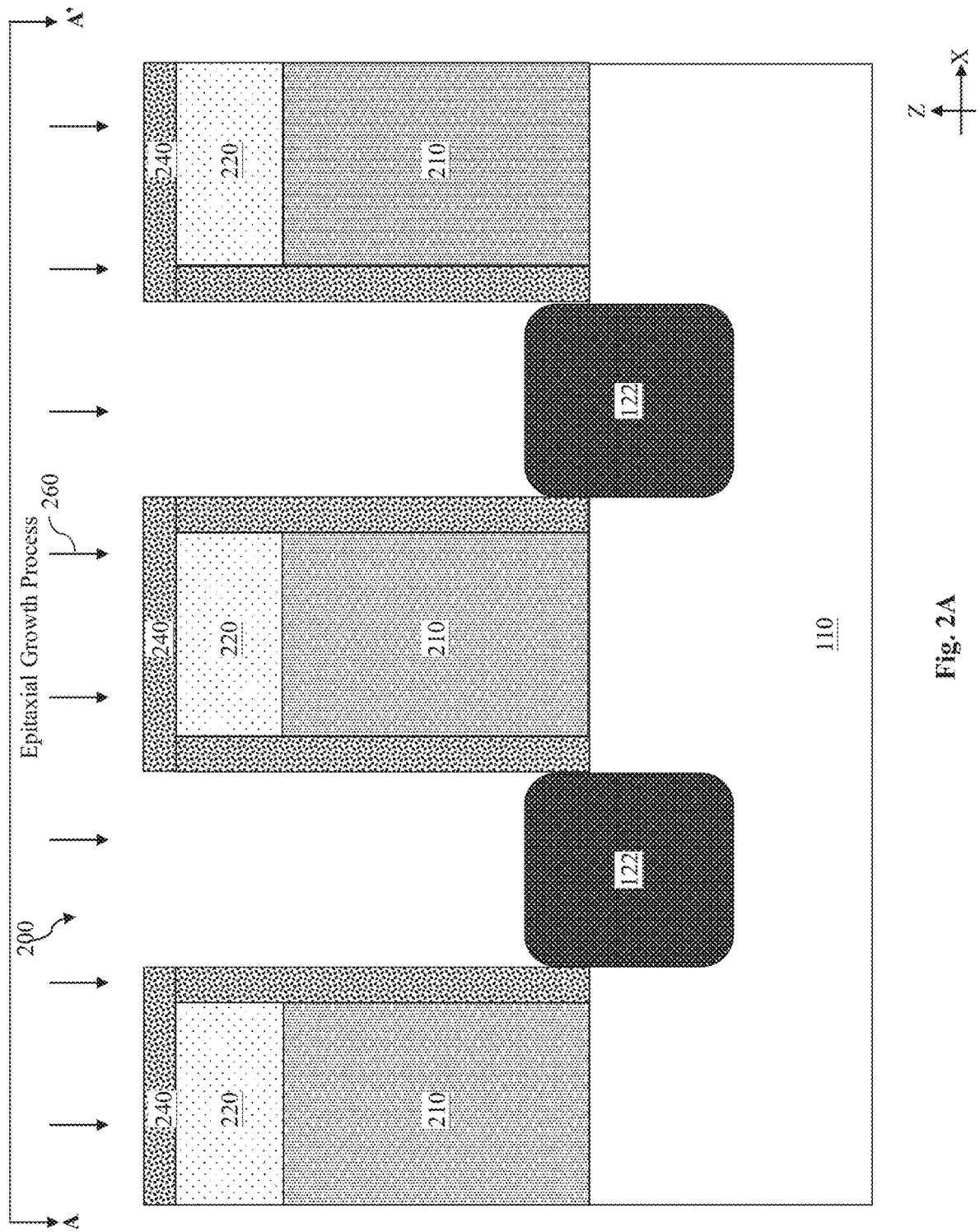
Figure 2B:
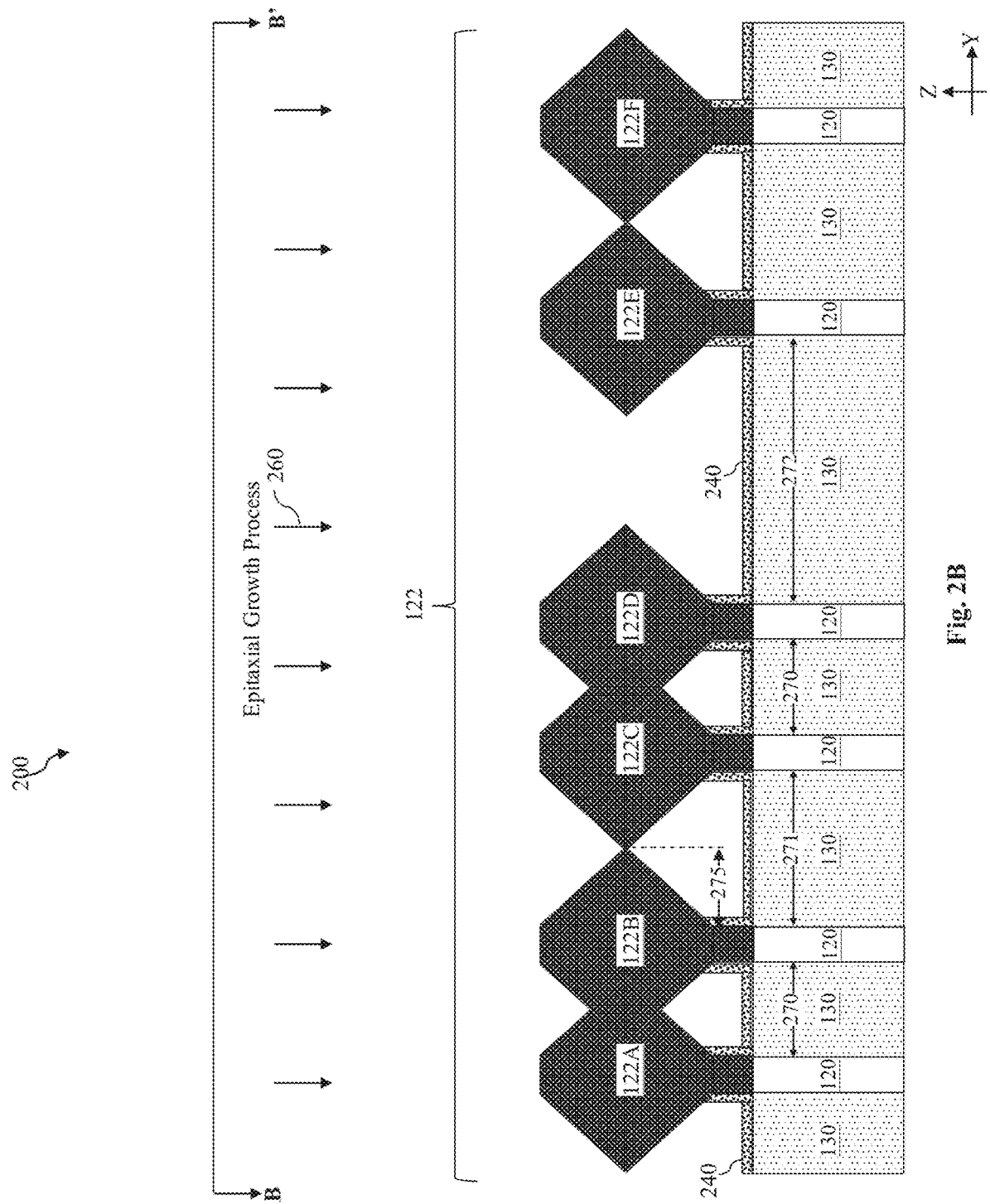

Referring to FIGS. 2A-2B, the IC device 200 includes the substrate 110 discussed above with reference to FIGS. 1A-1C, for example a silicon substrate. The substrate includes a plurality of active regions, for example the fin structures 120 discussed above with reference to FIGS. 1A-1B. The fin structures 120 each extend laterally in the X-direction, and they are separated from one another in the Y-direction by the isolation structures 130.

As shown in FIG. 2A, the IC device 200 also includes dummy gate structures 210 that are disposed over the substrate 110. The dummy gate structures 210 may each include a dummy gate dielectric layer and a polysilicon gate electrode, and they will be removed in a gate replacement process discussed below. A plurality of hard masks 220 are disposed over the dummy gate structures 210. The hard masks 220 may be used to define the dummy gate structures 210 in one or more patterning processes. Gate spacers 240 are formed on the sidewalls of the dummy gate structures 210 and the hard masks 220. The gate spacers 240 may each include a dielectric material, for example silicon nitride (SiN), silicon carbon nitride (SiCN), or silicon carbon oxynitride (SiCON).

An epitaxial growth process 260 may be performed to the IC device 200 to epitaxially grow source/drain components 122 of the FinFET transistors. The source/drain components 122 are grown on/over the fin structures 120 (as shown in FIG. 2B), and between the dummy gate structures 210 (as shown in FIG. 2A). These source/drain components 122 may belong to different transistors. As a non-limiting example shown in FIG. 2B, the source/drain components 122A and 122B belong to a first NFET, the source/drain components 122C and 122D belong to a second NFET, the source/drain component 122E belong to a first PFET, and the source/drain component 122F belong to a second PFET.

The fin structures 120 on which the source/drain components 122A and 122B are grown are separated by a spacing 270. The same is true for the source/drain components 122C and 122D. In some embodiments, the spacing 270 is in a range between about 20 nanometers (nm) and about 32 nm. This range of the spacing 270 is configured to facilitate the merging of the source/drain components 122A-122B into each other (and the source/drain components 122C-122D into each other), which is desirable since they belong to the same transistor. In comparison, the fin structures 120 on which the source/drain components 122B and 122C are grown are separated by a spacing 271 that is greater than the spacing 270. In some embodiments, the spacing 271 is in a range between about 50 nm and about 100 nm. In some embodiments, a ratio of the spacing 271 and the spacing 270 is in a range between about 1.5:1 and about 20:1. Also as shown in FIG. 2B, an outermost tip of the source/drain component (such as the source/drain component 122B) protrudes beyond a side surface of a nearest fin structure 120 by a distance 275. In other words, the distance 275 is indicative of how much a source/drain component protrudes laterally beyond the fin structure 120 on which it is grown. In some embodiments, a ratio of the distance 275 and the spacing 271 is in a range between about 1:2.5 and about 1:25.

A physical separation of the source/drain components 122B and 122C is desired, since they belong to different transistors, which should be kept physically and electrically separate. However, as transistors sizes continue to shrink, the larger spacing 271 (compared to the spacing 270) still may not be able to guarantee the physical separation between the source/drain components 122B and 122C from adjacent transistors. Sometimes, the source/drain components 122B and/or 122C may be grown to be larger than expected, which could cause the source/drain components 122B and 122C to inadvertently merge into each other. For example, when the ratio of the distance 275 and the spacing 271 approach about 1:2, the source/drain components from adjacent transistors may be at risk of merging into one another, even though they are meant to be kept separate. Process variations (e.g., alignment and/or overlay controls) may further exacerbate this problem.

Similarly, the source/drain components 122E-122F may merge into each other due to the shrinking spacing 273 between the fin structures 120 on which the source/drain components 122E-122F are formed, even though the source/drain components 122E-122F should be kept physically separate from each other, since they are from different PFETs. The merging of the source/drain components 122B-122C or the merging of the source/drain components 122E-122F may cause electrical shorting between transistors that should otherwise be electrically isolated from each other, which could degrade the performance and/or lower the yield of the IC device 200.

It is also noted that the electrical shorting may occur not only between adjacent NFETs (as is the case between the source/drain components 122B and 122C), or between adjacent PFETs (as is the case between the source/drain components 122E and 122F), but it may also occur between an NFET and a PFET that are located adjacent to one another too. For example, the fin structures 120 on which the source/drain components 122D and 122E are grown are separated by a spacing 272. The spacing 272 is configured to be larger than the spacing 271 to prevent the merging between the source/drain components 122D and 122E. However, the ever-shrinking device sizes and potential process variations may even cause the merging between the source/drain components 122D (from an NFET) and 122E (from a PFET) in some devices, even though the spacing 272 is large enough to prevent such a merging in most device. Again, such an unintentional merging between the adjacent NFET and PFET devices would be undesirable, as it could degrade device performance or lower yield.

In order to overcome this unintentional source/drain merging problem discussed above, the present disclosure will implement electrical isolation structures between the source/drain components that are at risk of merging into one another. These electrical isolation structures may be implemented at different stages of fabrication, as discussed below in more detail.

Figure 3A:
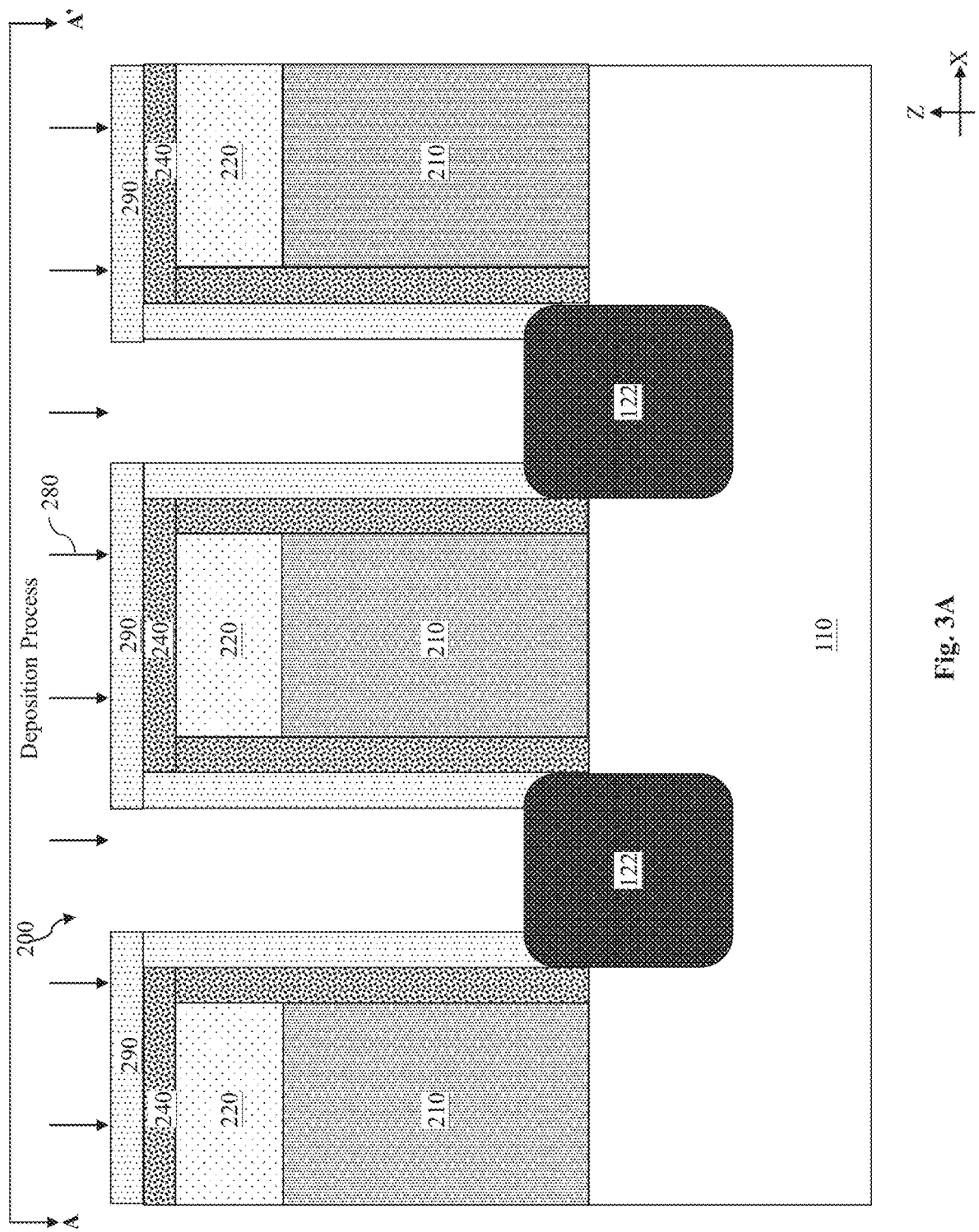
Figure 3B:
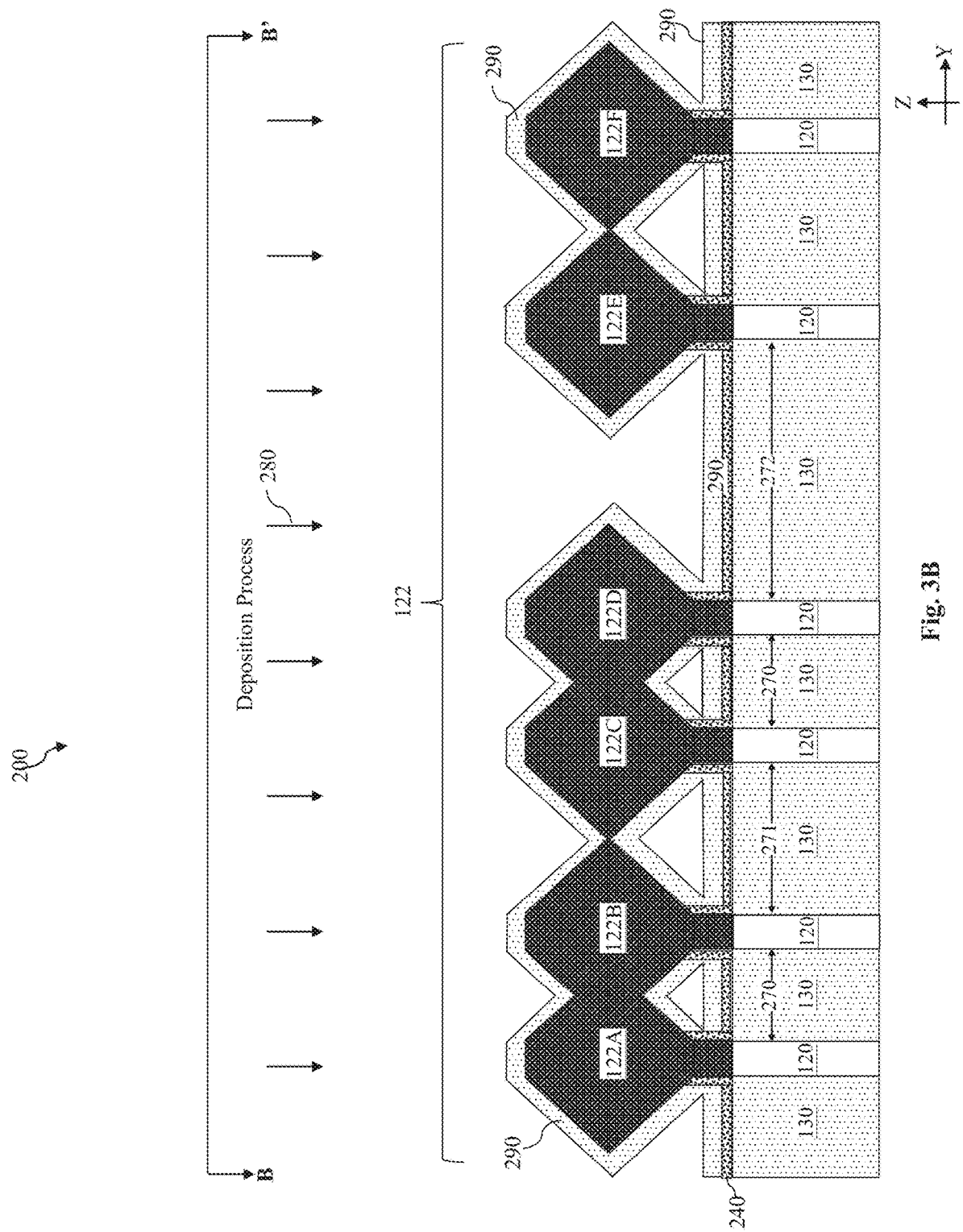

Referring now to FIGS. 3A and 3B, a deposition process 280 is performed to the IC device 200 to form an etching-stop layer 290. The deposition process 280 may include CVD, PVD, ALD, or combinations thereof. In some embodiments, the etching-stop layer 290 includes a dielectric material, for example silicon nitride (SiN), silicon carbon nitride (SiCN), or silicon carbon oxynitride (SiCON). The etching-stop layer 290 is formed over and covers the gate spacers 240 and the source/drain components 122A-122F.

Figure 4A:
Figure 4B:
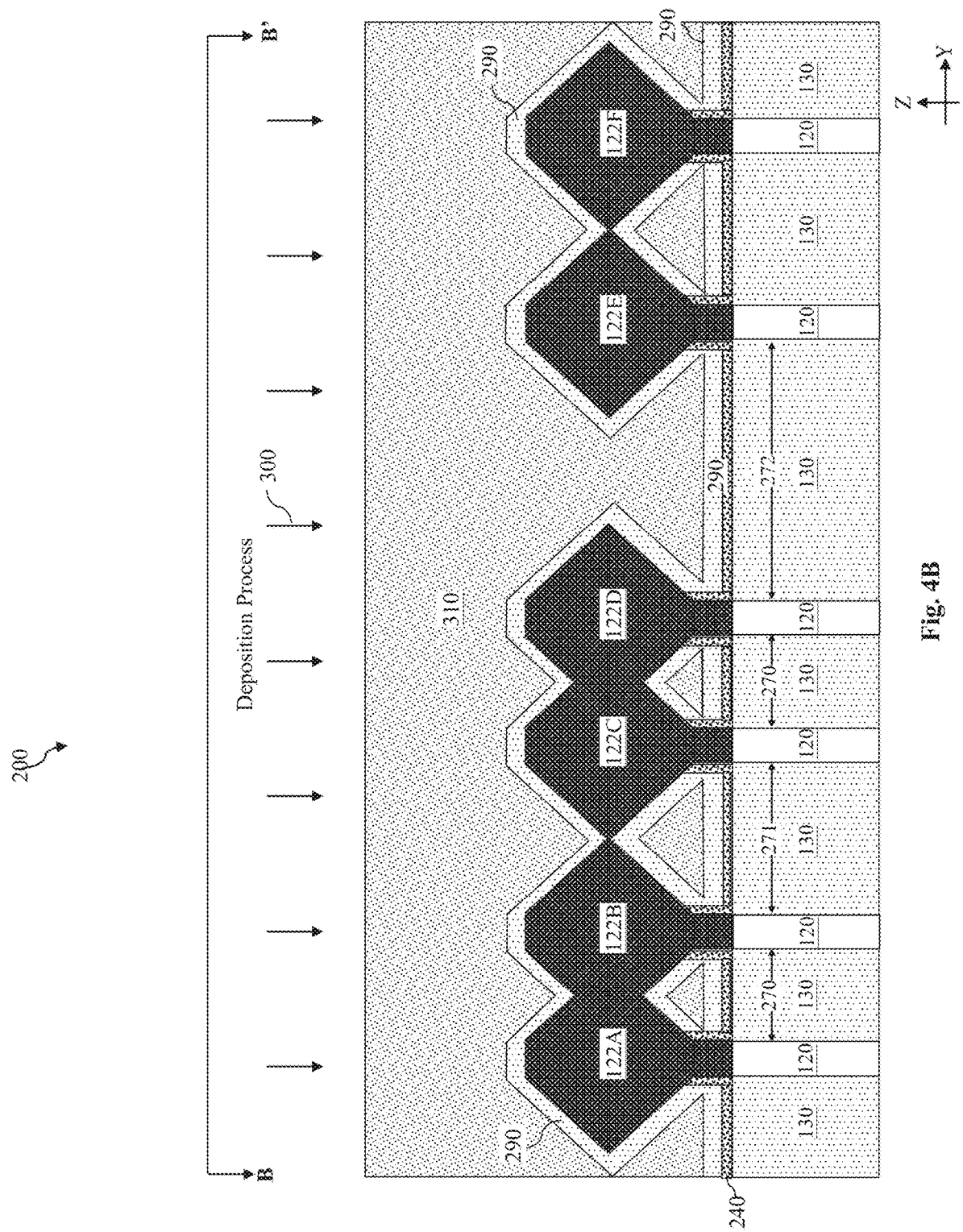

Referring now to FIGS. 4A and 4B, a deposition process 300 is performed to the IC device 200 to form a material layer 310. The deposition process 300 may include CVD, PVD, ALD, or combinations thereof. In some embodiments, the material layer 310 may include a thermally stable material, such as a semiconductor material, for example amorphous silicon, germanium, or combinations thereof. The material layer 310 and the source/drain components 122A-122F may have similar material compositions. This is one of the reasons why the etching-stop layer 290 is formed before the material layer 310 is deposited. The etching-stop layer 290 provides separation between the source/drain components 122A-122F and the material layer 310. Had the etching-stop layer 290 not been formed, the subsequent processing (e.g., removal thereof) done to the material layer 310 may inadvertently damage the source/drain components 122A-122F as well, which would have been undesirable. Here, the etching-stop layer 290 ensures that the source/drain components 122A-122F are protected from any fabrication processes performed to the material layer 310. It is understood that the upper surface of the material layer 310 may be planarized by a planarization process, such as a CMP process.

Figure 5A:
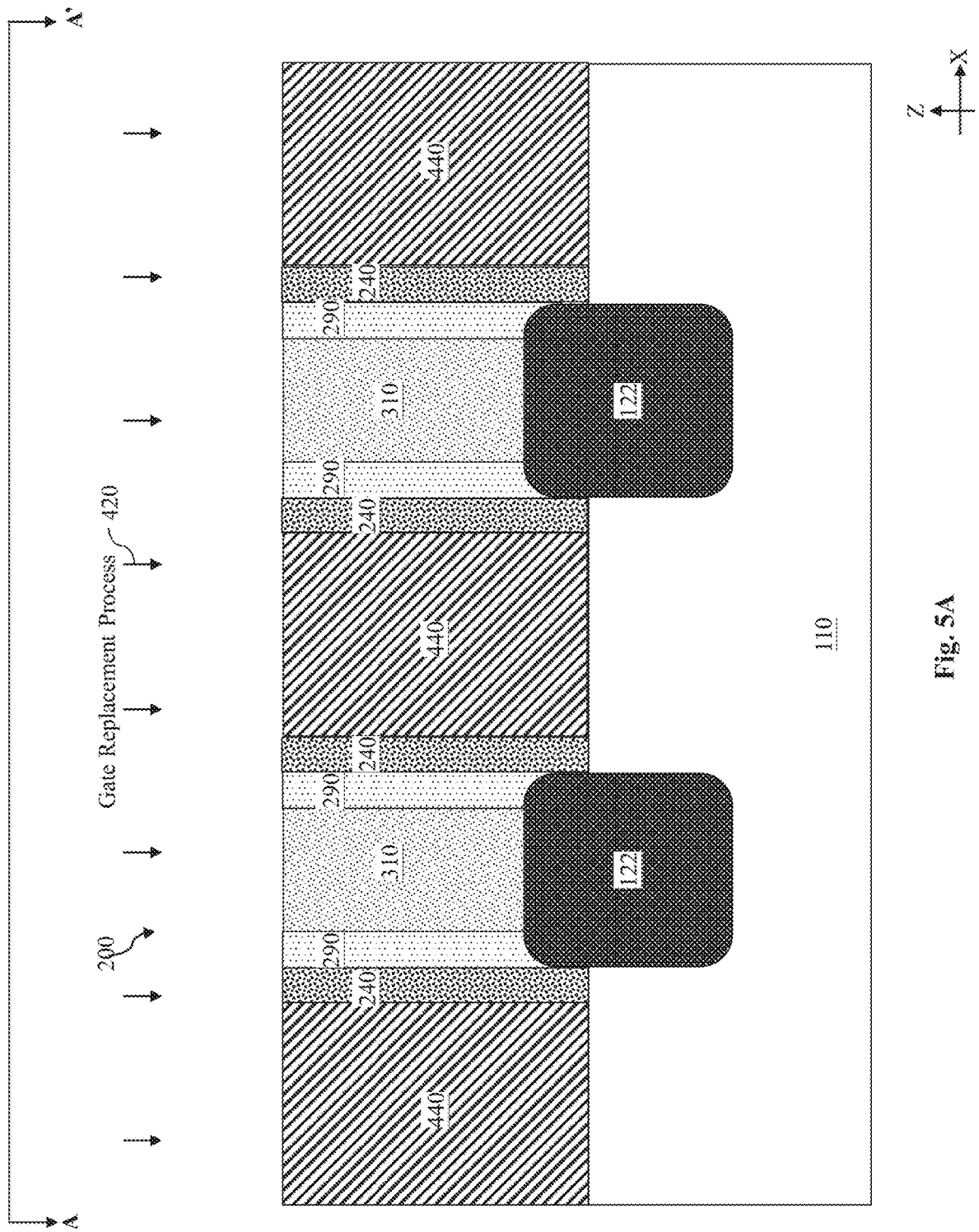
Figure 5B:
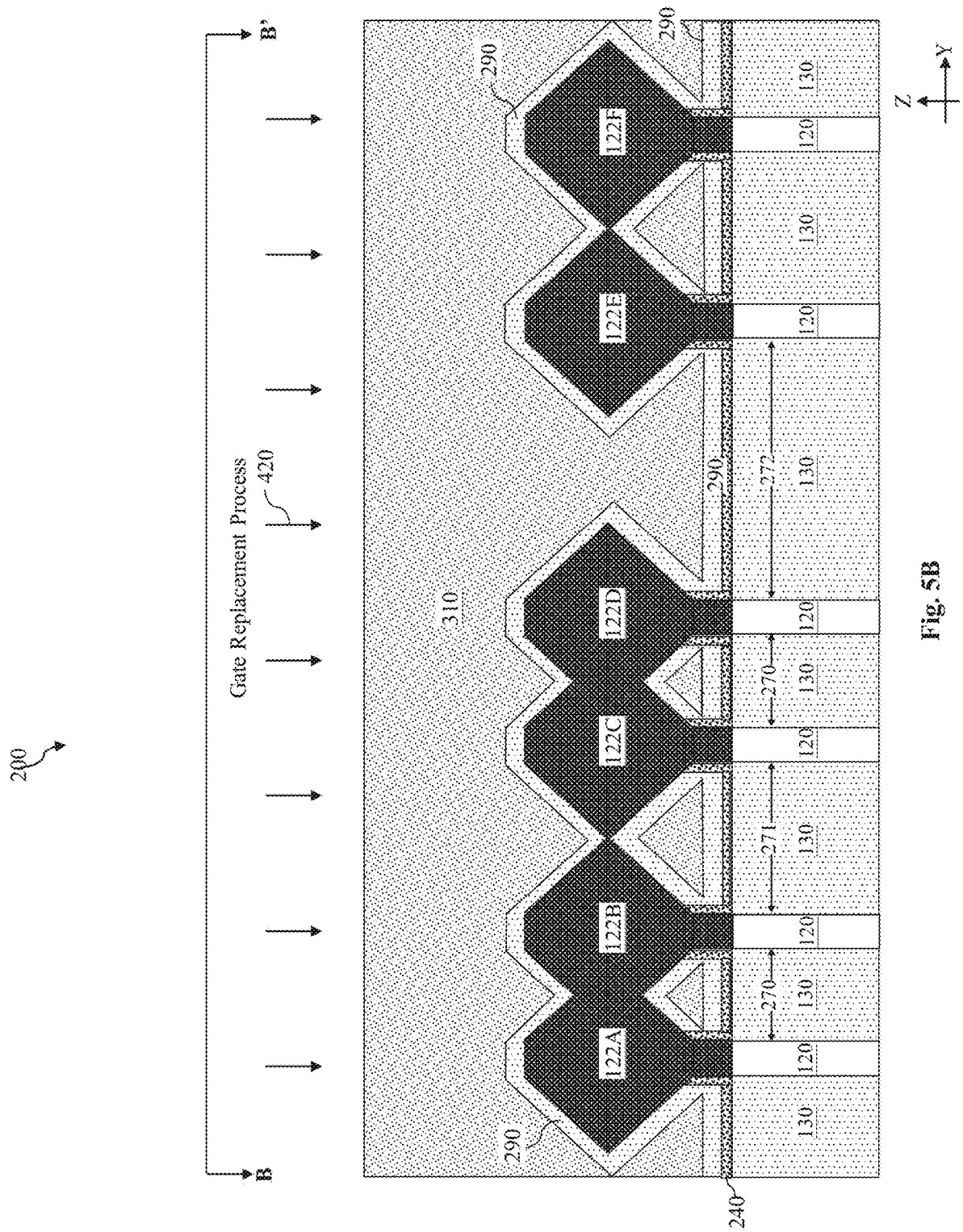

Referring now to FIGS. 5A-5B, a gate replacement process 420 is performed to the IC device 200 to replace the dummy gate structures 210 with high-k metal gate (HKMG) structures 440. The dummy gate structures 210 may be removed using etching processes, which leaves openings (trenches) in the material layer 310. These openings or trenches are subsequently filled by the metal gate electrodes of the HKMG structures 440. In some embodiments, if the dummy gate structures 210 include a dummy gate dielectric layer (e.g., a silicon oxide gate dielectric), then the dummy gate dielectric layer will also be replaced by a high-k gate dielectric layer as a part of the KHMG structures 440. As such, HKMG structures 440 may each include a high-k gate dielectric and a metal gate electrode. Example materials of the high-gate k dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), aluminum titanium nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. A dielectric layer may also be formed over the fill metal layer. In some embodiments, the HKMG structures 440 may include additional layers, such as interfacial layers, capping layers, diffusion/barrier layers, or other applicable layers.

As a part of the gate replacement process 420, one or more high-temperature processes may be performed to the semiconductor device 200, such as annealing processes. The temperature of the high-temperature processes may exceed a predefined threshold. The need to withstand relatively high temperatures during one or more fabrication processes is one of the reasons why the material layer 310 is selected to have a thermally stable material composition (e.g., silicon or germanium). Had the material layer 310 been selected to have a different material composition that is not thermally stable (or otherwise cannot withstand the high temperatures associated with the gate replacement process 420), the material layer 310 could have been damaged as a result of the gate replacement process 420.

After the HKMG structures 440 are formed in the trenches to replace the dummy gate structures 210, etch-back and CMP processes may also be performed to reduce the height of the HKMG structures 440 and the dielectric layer 400, as well as to planarize the upper surfaces of the HKMG structures 440 with the upper surfaces of the dielectric layer 400. Note that the HKMG structures 440 are not directly visible in FIG. 5B, since the cross-sectional cut shown in FIG. 5B is taken along the cutline B-B', which is outside of the HKMG structures 440.

Figure 6A:
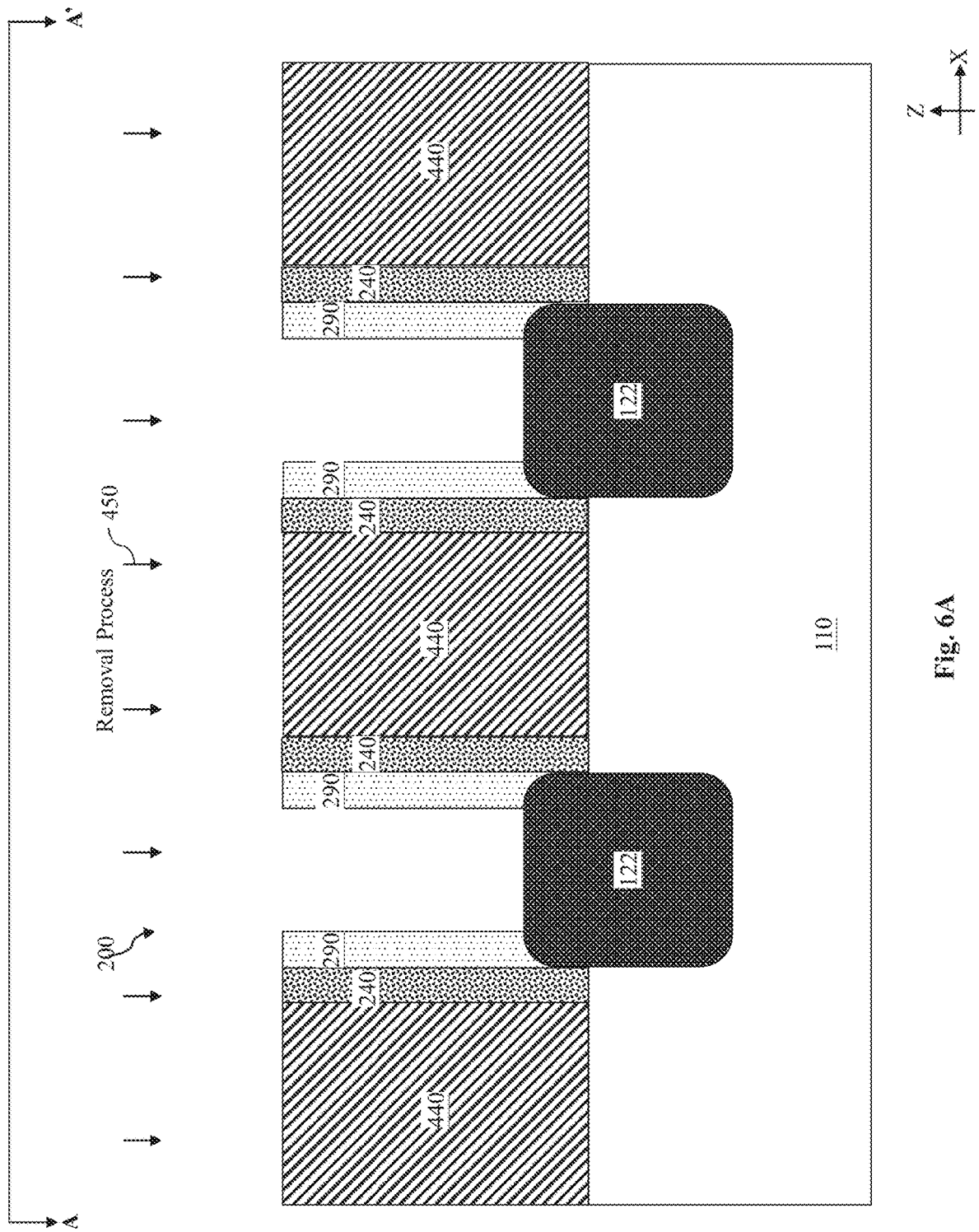
Figure 6B:
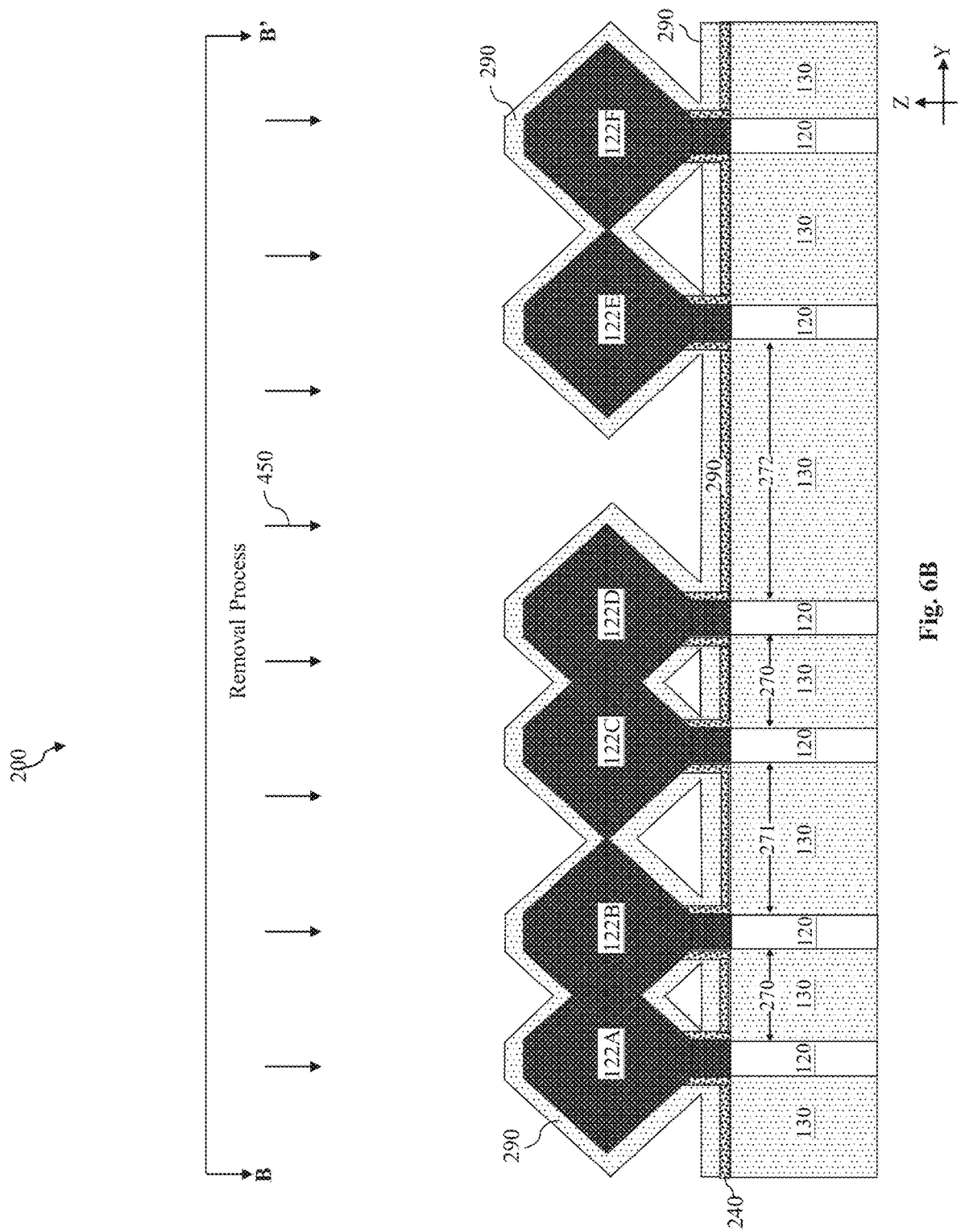

Referring now to FIGS. 6A-6B, a removal process 450 is performed to the IC device 200 to remove the material layer 310. In some embodiments, the removal process 450 includes one or more etching processes. The etching processes are configured to have etching selectivity between the material layer 310 and the etching-stop layer 290. For example, the etching rate for the material layer 310 may be substantially greater (e.g., ten times or more) than the etching rate for the etching-stop layer 290. As such, the removal process 450 may remove the material layer 310 substantially without removing the etching-stop layer 290. Therefore, the etching-stop layer 290 can protect the source/drain components 122A-122F while the material layer 310 is removed.

Figure 7A:
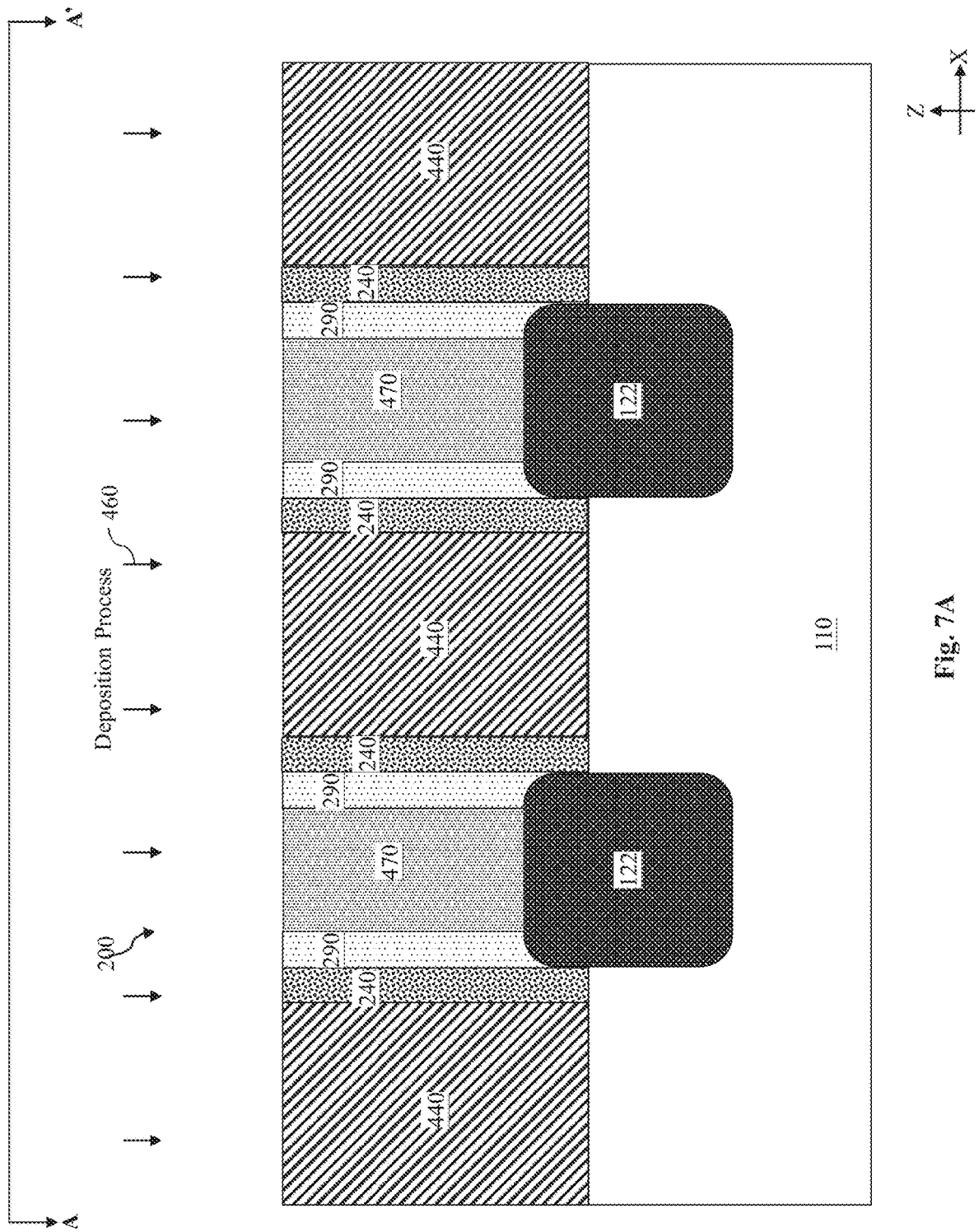
Figure 7B:
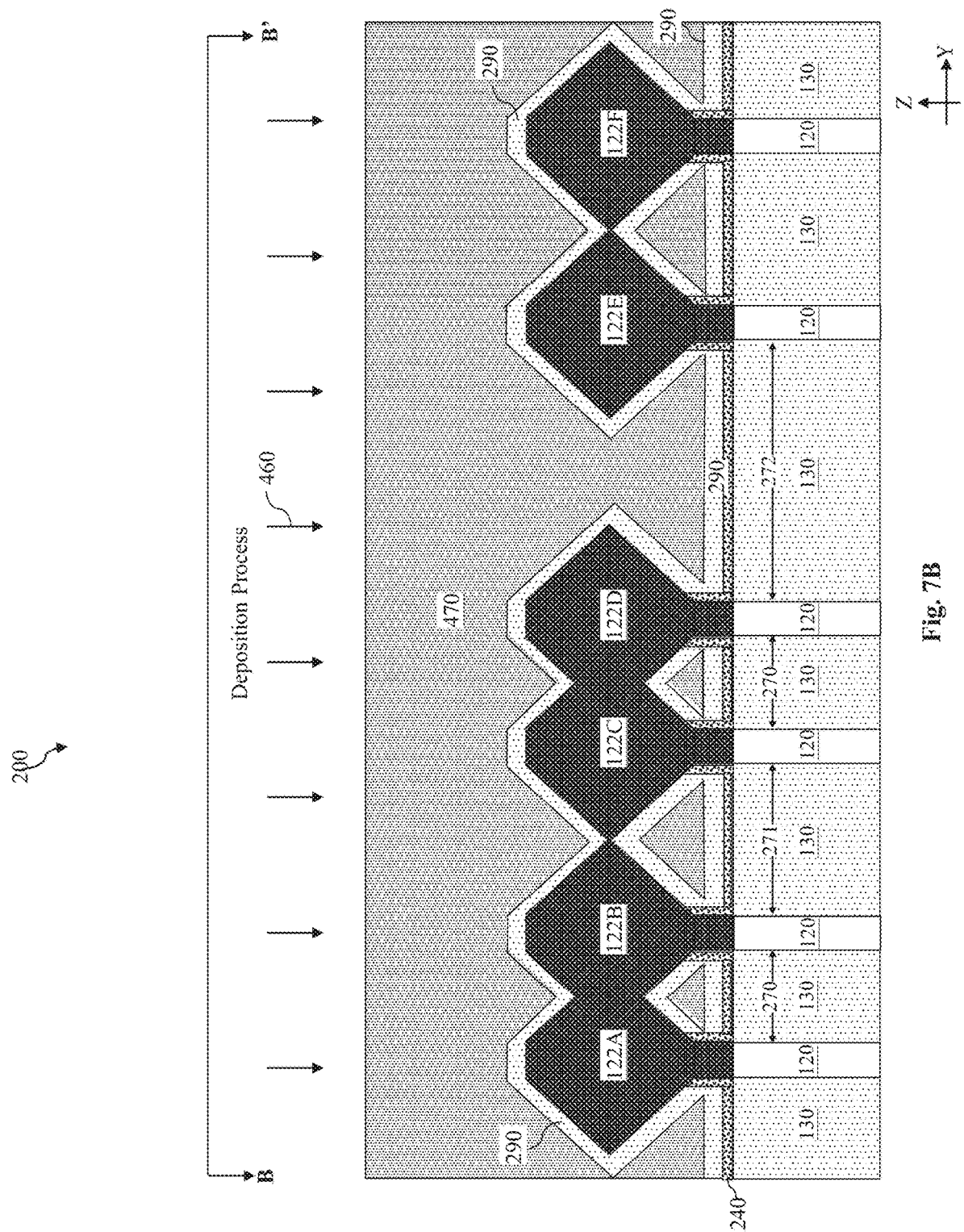

Referring now to FIGS. 7A-7B, a deposition process 460 is performed to the IC device 200 to form a material layer 470 in place of the removed material layer 310. The deposition process 460 may include CVD, PVD, ALD, or combinations thereof. A planarization process such as a CMP process may be performed to planarize the upper surface of the material layer 470. The material layer 470 has a different material composition compared to the material layer 310. For example, whereas the material layer 310 is thermally stable (e.g., can withstand a high temperature) but may not be sufficiently patternable, the material layer 470 may not be as thermally stable as the material layer 310 but is more patternable than the material layer 310. Since the high temperature processes (e.g., annealing) of the gate replacement process 420 have already been performed before the formation of the material layer 470, the fact that the material layer 470 may not be able to withstand high temperatures is inconsequential. However, the material layer 470 will undergo patterning processes to define openings therein (as will be discussed in more detail below). As such, the material layer 470 is configured to have a more patternable material, at least compared to the material layer 310. The material layer 470 may also have a different material composition compared to the etching-stop layer 290. In some embodiments, the material layer 470 includes spin-on carbon (SOC).

Figure 8A:
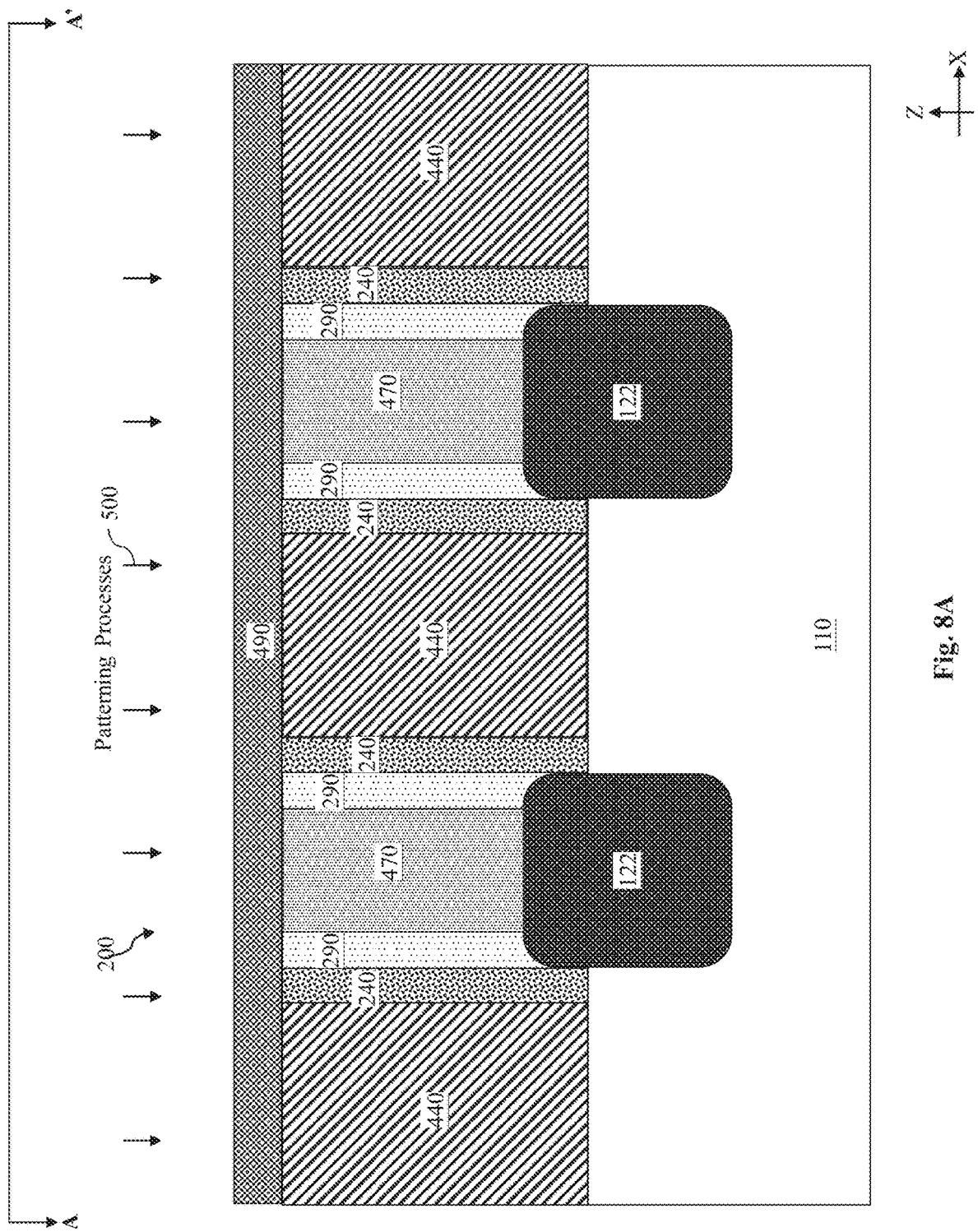
Figure 8B:
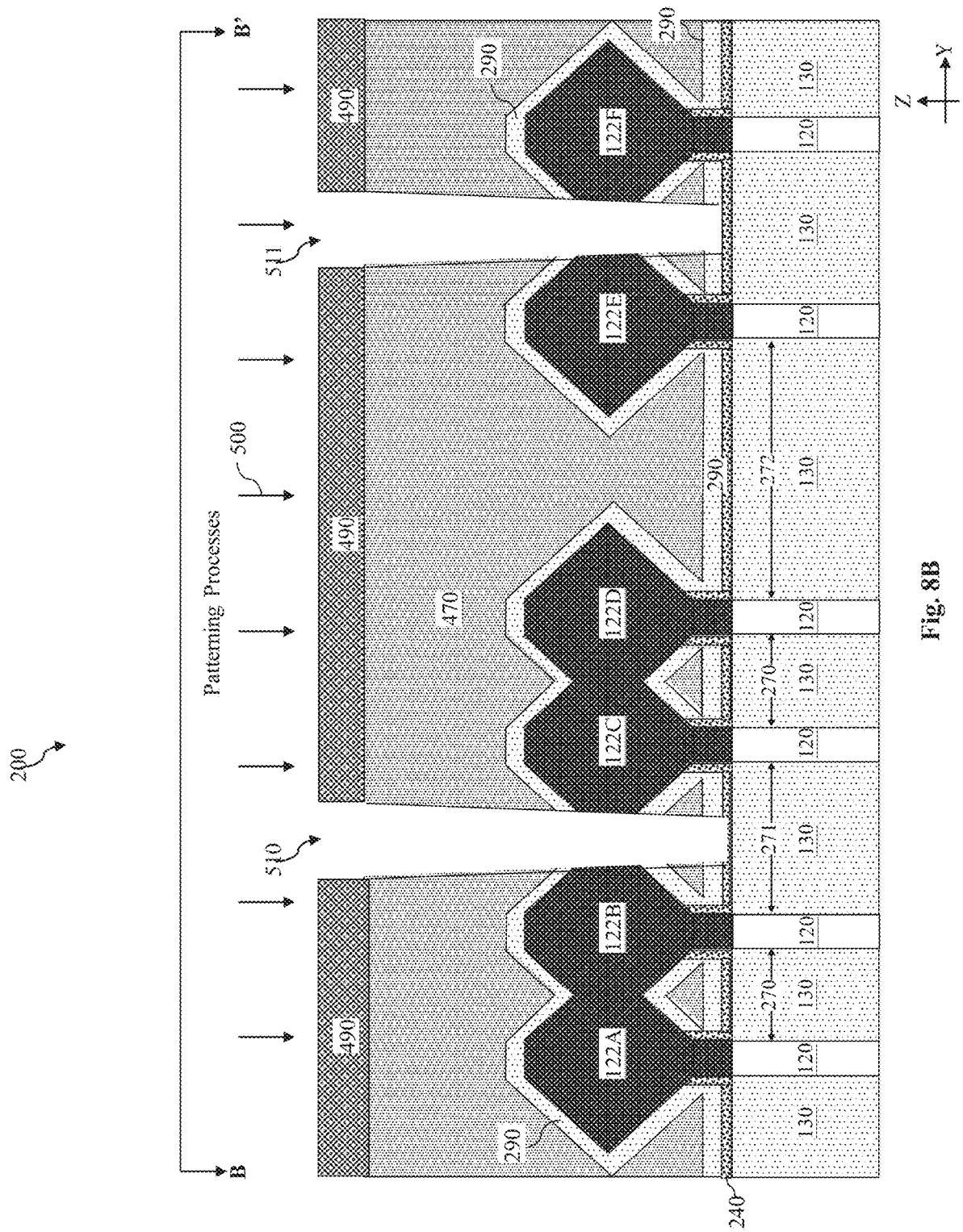

Referring now to FIGS. 8A-8B, patterning processes 500 may be performed to the IC device 200. First, a patterned mask layer 490 is formed over the HKMG structures 440 and the material layer 470. The patterned mask layer 490 is formed to include openings 510 and 511. Using the patterned hard mask layer 490 as an etching mask layer, the patterning processes 500 may perform etching processes to the IC device 200 to extend the openings 510 and 511 downward in the Z-direction. The opening 510 extends vertically through the material layer 470 and "breaks up" the merged portions of the source/drain components 122B-122C of the NFETs. The opening 511 extends vertically through the material layer 470 and "breaks up" the merged portions of the source/drain components 122E-122F of the PFETs. In other words, the patterning processes 500 remove not only portions of the material layer 470 and the etching-stop layer 290, but they also remove portions of the source/drain components 122B-122C and 122E-122F, such that they are no longer in physical contact with each other.

Because multiple different types of materials need to be etched away in order to form the openings 510 and 511, the patterning processes 500 may include multiple steps, where each etching step utilizes a different etchant to etch away a specific type of material. In some embodiments, a first etching step of the patterning processes 500 uses $NH_3$ and $O_2$ as an etchant to etch away the material layer 470, a second etching step of the patterning processes 500 uses $NF_3$ and $H_2$ as an etchant to etch away the source/drain components 122B-122C and 122E-122F, and a third etching step of the patterning processes 500 uses $NH_3$, $NF_3$, or $CH_3F$ plus $H_2$ as an etchant to etch away the etching-stop layer 290. Of course, the portions of the various materials disposed underneath the patterned mask layer 490 are protected and are not etched away during the etching processes.

The performance of the patterning processes 500 are one of the unique aspects of the present disclosure, as it accomplishes two goals simultaneously:

1. Cutting open the merged source/drain components 122B-122C and 122E-122F. As a result, the previously merged-together source/drain components 122B-122C and 122E-122F are now separated from one another, thereby preventing electrical bridging or shorting; and
2. Defining the locations of the to-be-formed source/drain contacts. For example, the patterned mask layer 490 effectively defines the locations of the to-be-formed source/drain contacts, which will be formed in place of the to-be-removed material layer 470 in regions outside of (or other than) the openings 510-511, as discussed in more detail below.

Note that the source/drain components 122B, 122C, 122E, and 122F each have an asymmetrical profile as a result of being affected by the etching process 330. Such an asymmetrical profile is one of the unique physical characteristics of the IC device 200 of the present disclosure and will be discussed below in greater detail.

Due to the location of the cross-sectional cut of FIG. 8A, the openings 510-511 are not directly visible in FIG. 8A. It is understood that in some other embodiments, an opening may optionally be etched between the source/drain components 122D-122E, so as to prevent the potential merging between them, if these source/drain components 122D-122E are supposed to be kept electrically separate from each other.

Figure 9A:
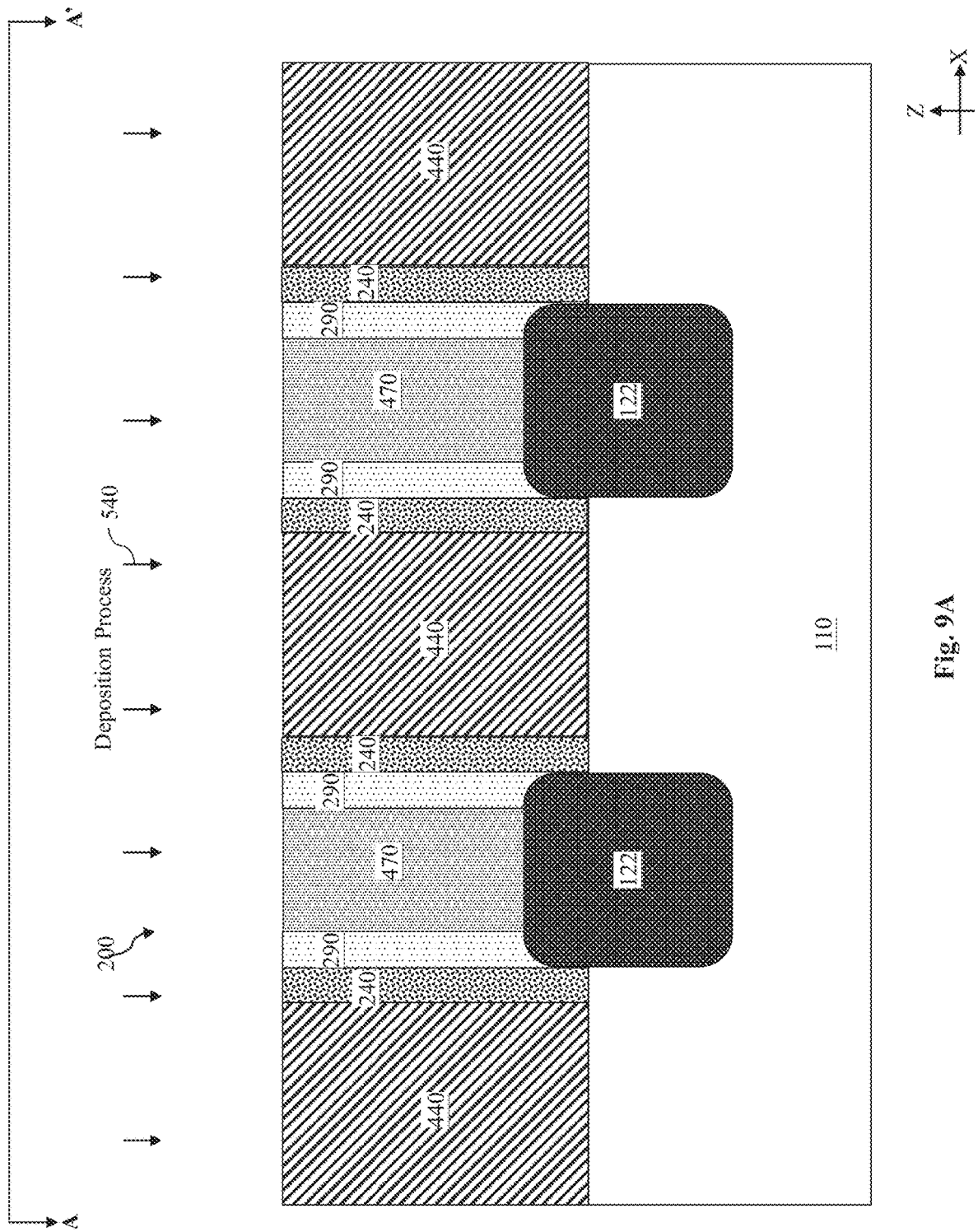
Figure 9B:
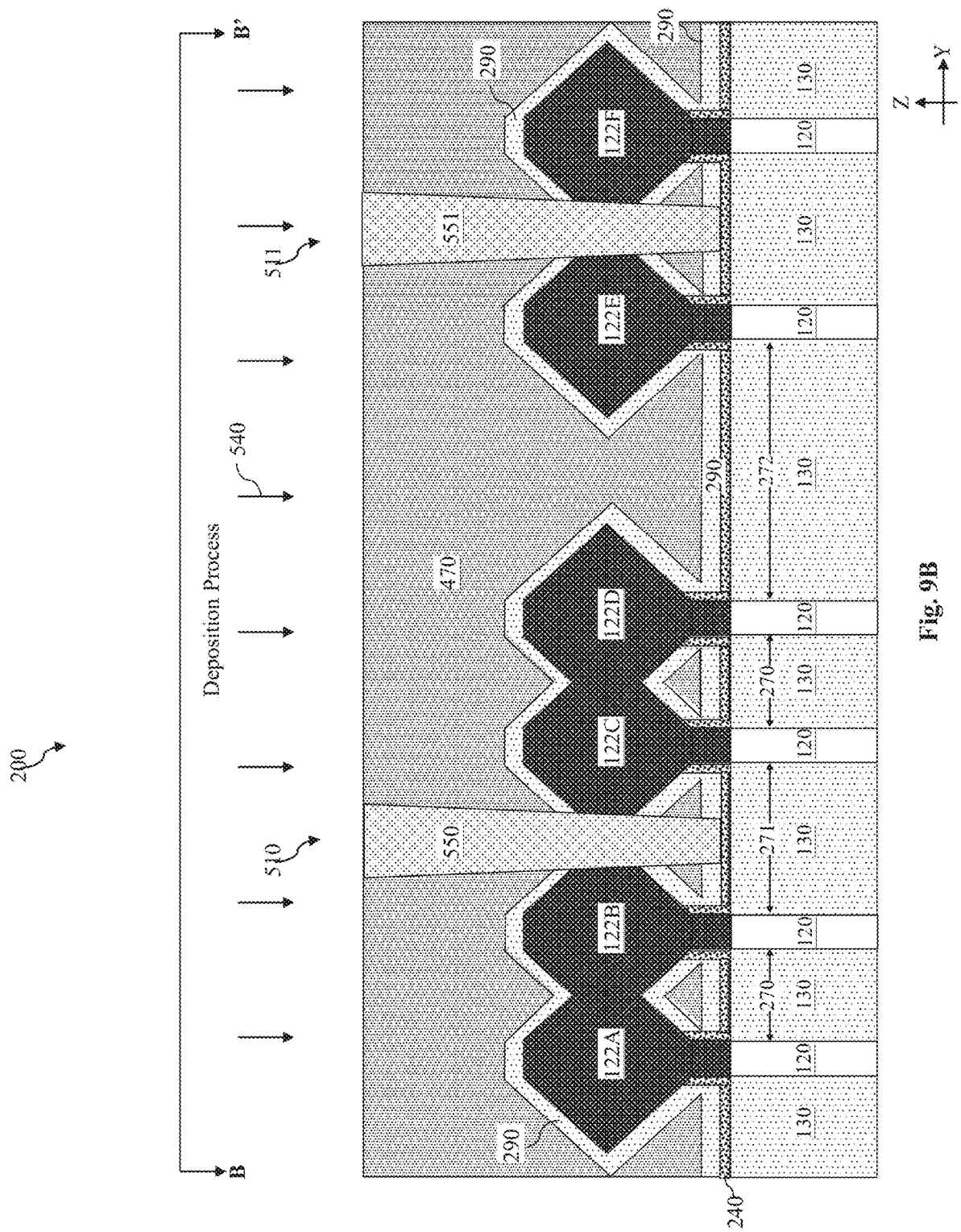

Referring now to FIGS. 9A-9B, the patterned mask layer 490 is removed, and a deposition process 540 is performed to fill the openings 510 and 511 with isolation structures 550 and 551, respectively. In some embodiments, the deposition process 540 includes a flowable chemical vapor deposition (FCVD) process followed by an annealing process. In some embodiments, the isolation structures 550 and 551 are each comprised of a single type of dielectric material. In other embodiments, the isolation structures 550 and 551 are each comprised of multiple types of dielectric materials. In some embodiments, the isolation structures 550 and 551 may include a low-k dielectric material (e.g., a dielectric material having a dielectric constant less than that of silicon oxide, which is about 3.9), such as a porous material. In other embodiments, the isolation structures 550 and 551 may include silicon nitride, silicon oxide, silicon oxynitride, silicon carbon oxynitride, silicon carbide, a high-k dielectric material (e.g., hafnium oxide or lanthanum oxide), or combinations thereof. In some embodiments, the isolation structures 550 and 551 may be formed to have air gaps embedded therein, so as to further lower the dielectric constant of the isolation structures 550 and 551. The method of forming such air gaps is descried in more detail in the related U.S. patent application Ser. No. 16/917,778, filed on Jun. 30, 2020, entitled "Isolation Structure For Preventing Unintentional Merging of Epitaxially Grown Source/Drain", the disclosure of which is hereby incorporated by reference in its entirety.

The isolation structure 550 physically and electrically separates the source/drain components 122B-122C from one another, and the isolation structure 551 physically and electrically separates the source/drain components 122E-122F from one another. It is understood that a planarization process such as a CMP process may be performed to planarize the upper surfaces of the isolation structures 550 and 551 with the remaining portions of the material layer 470.

Figure 10B:
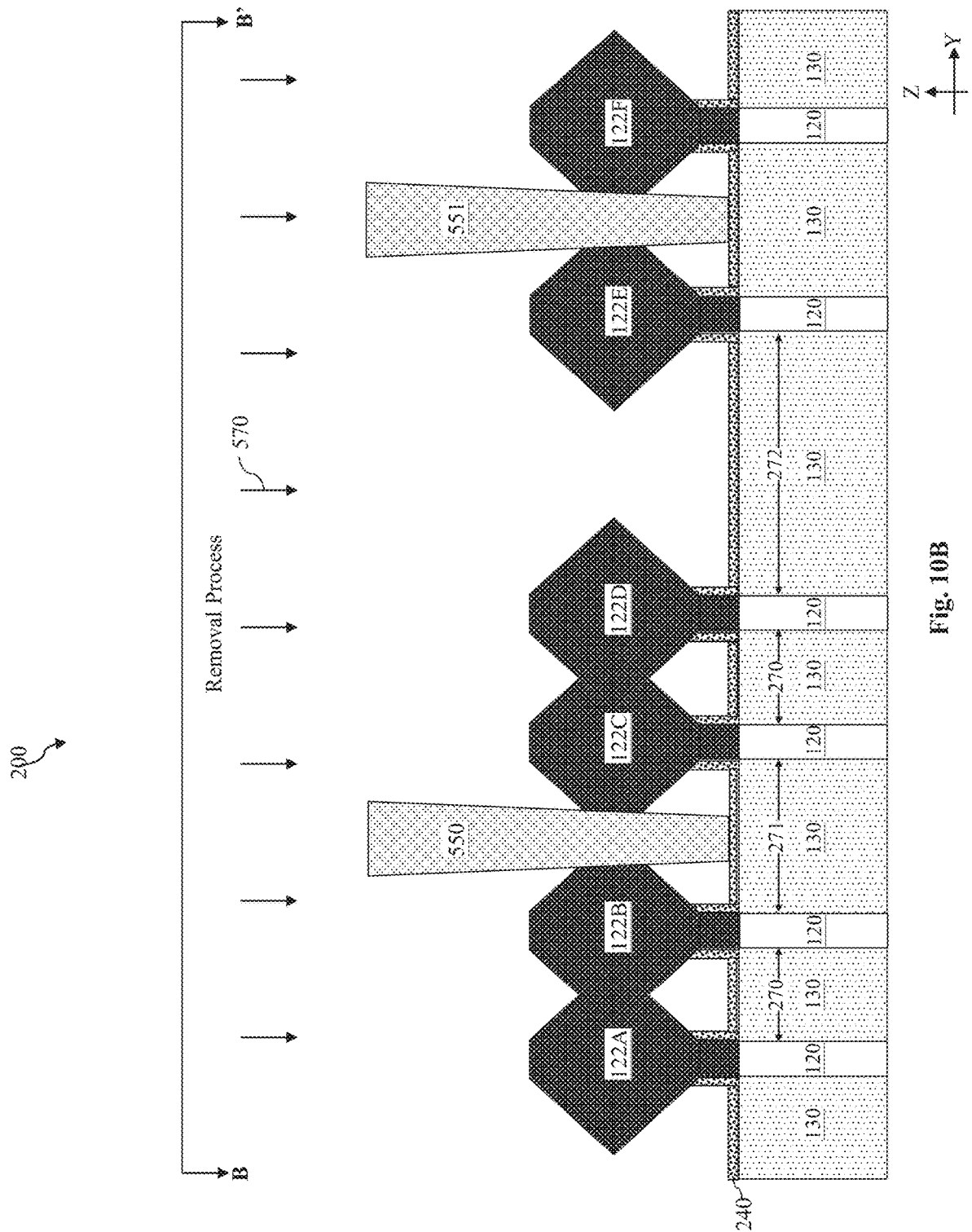

Referring now to FIGS. 10A-10B, a removal process 570 is performed to the IC device 200 to remove the material layer 470. In some embodiments, the removal process 570 may include an etching process that has an etching selectivity between the material layer 470 and the other layers of the IC device 200, such as the HKMG structures 440 and the source/drain components 122. In this manner, the material layer 470 can be etched away (e.g., due to a significantly higher etching rate) without substantially removing the other layers, such as the source/drain components 122, the HKMG structures 440, the gate spacers 240. Note that the etching-stop layer 290 may also be removed in the removal process 570, or removed using another etching process in an earlier step. The removal of the material layer 470 exposes the source/drain components 122A-122F.

Figure 11A:
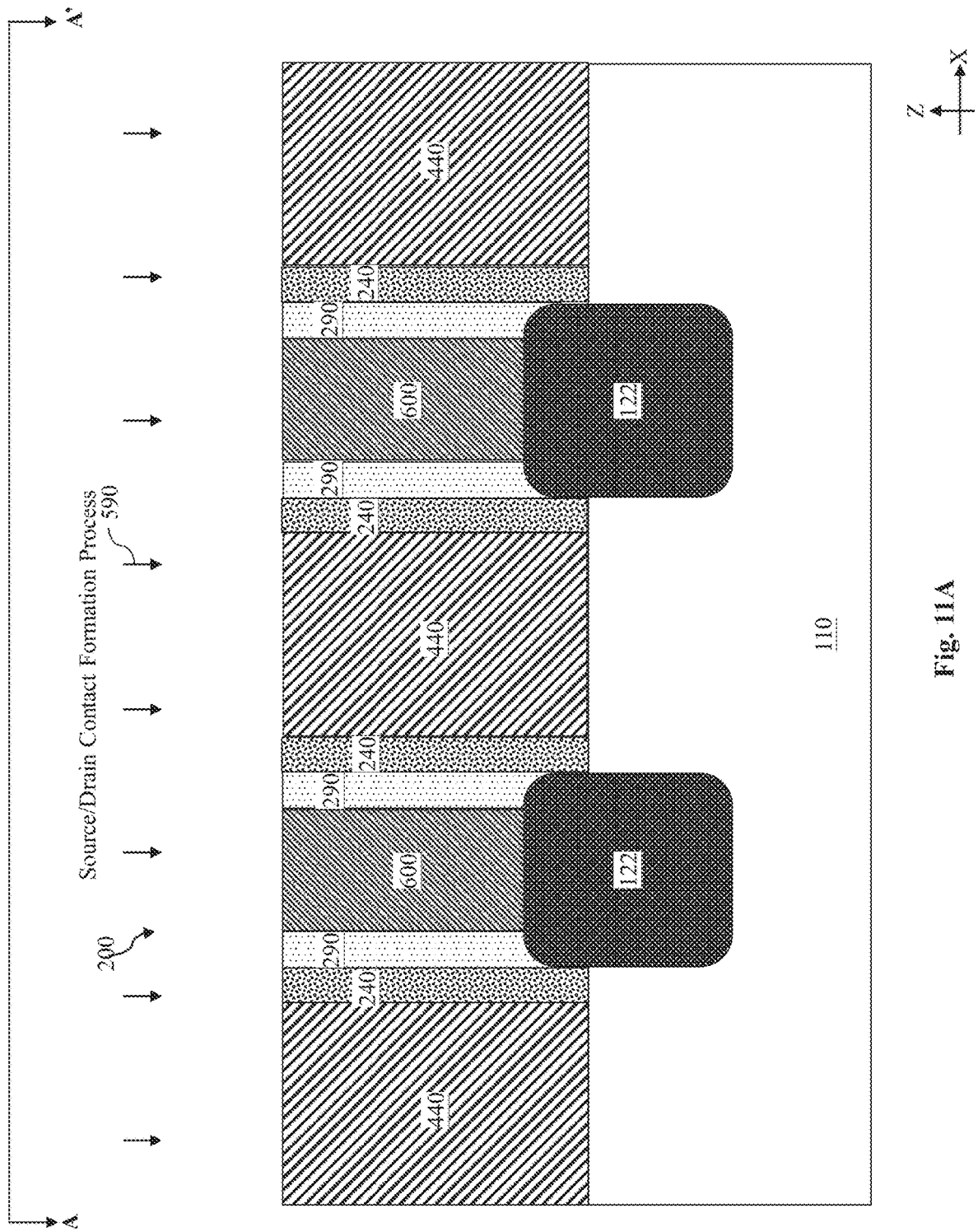
Figure 11B:
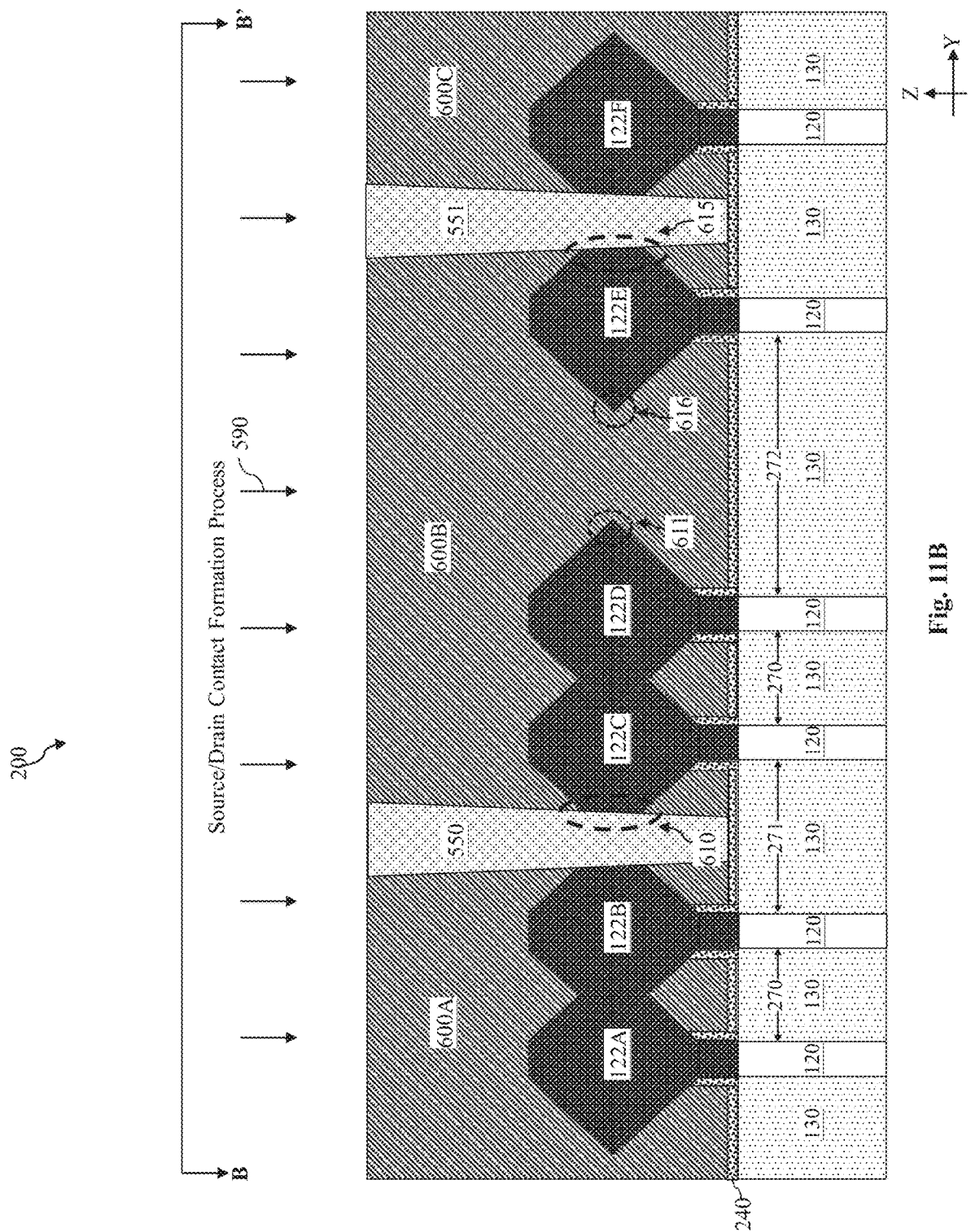

Referring now to FIGS. 11A-11B, a source/drain contact formation process 590 is performed to form source/drain contacts 600. The source/drain contact formation process 590 may include one or more deposition processes in which a conductive material is deposited on the source/drain components 122A-122F. In some embodiments, the conductive material may include tungsten, titanium, cobalt, aluminum, copper, or combinations thereof. The source/drain contact formation process 590 may also include a planarization process to planarize the upper surface of the deposited conductive material. The resulting structures are the source/drain contacts that surround the source/drain components 122A-122B in multiple different directions. For example, the source/drain contact 600A is in direct contact with the upper and side surfaces of the source/drain components 122A-122B, the source/drain contact 600B is in direct contact with the upper and side surfaces of the source/drain components 122C-122E, and the source/drain contact 600C is in direct contact with the upper and side surfaces of the source/drain component 122F.

FIG. 11B demonstrates various unique physical characteristics of the IC device 200. One such unique physical characteristic is the asymmetry of the source/drain components. For example, as shown in FIG. 11B, the source/drain structure comprising the source/drain components 122C-122D has such an asymmetry, as does the source/drain structure comprising the source/drain components 122A-122B. The source/drain component 122C has an outermost portion 610 on its "left side", and the source/drain component 122D has an outermost portion 611 on its "right side". The outermost portion 610 and the outermost portion 611 have different physical cross-sectional profiles, because the left side of the source/drain component 122C was etched by the patterning process 500 (see FIG. 8B), but the right side of the source/drain component 122D was unetched by the patterning process 500. In some embodiments, the outermost portion 610 may resemble a line, or a relatively flat edge, which may also be somewhat slanted, since the opening 510 (see FIG. 8B) is slanted or otherwise has a trapezoidal top-wide-bottom-narrow profile. It may be said that the outermost portion 610 (as a side surface of the source/drain component 122C) forms an interface with the "right" sidewall of the isolation structure 550, where the interface is substantially linear or straight.

In contrast, the outermost portion 611 has a relatively pointy profile, or at least a somewhat rounded protrusion, as a result of the epitaxial growth. Such a tip protrudes laterally away from the isolation structure 550 in the Y-direction. As such, as a combined source/drain structure, the source/drain components 122C/122D has an asymmetric profile, since the outermost portions 610 and 611 are shaped differently from one another.

Similarly, the side surface of the source/drain component 122B of the source/drain structure comprising the source/drain components 122A-122B also forms an interface with the "left" sidewall of the isolation structure 550, where the interface is substantially linear or straight. Meanwhile, the source/drain component 122A also has a laterally protruding tip that protrudes away from the isolation structure 550, which makes the source/drain structure asymmetrical as well.

In the case of the source/drain component 122E or 122F, they also each have one outermost portion 615 that is shaped as a line or a flat edge, and another outermost portion 616 that is shaped as a pointy tip or a rounded edge. In other words, the source/drain component 122E itself has an asymmetrical profile, as does the source/drain component 122F.

However, it is understood that the asymmetrical profile is not required for IC devices manufactured according to the present disclosure. In some embodiments of the present disclosure, both the "left" and "right" sides of a source/drain component (or multiple source/drain components merged together) may be etched, and therefore the resulting structure may have symmetrical source/drain components, where both the left outermost portion and the right outermost portion are shaped as lines or relatively flat edges.

Another unique physical characteristic of the IC device 200 is that the source/drain contacts 600A, 600B, and 600C are formed all around the source/drain components 122A-122F and come into contact with the different surfaces (including the upper surfaces and side surfaces) of the source/drain components 122A-122F. This is a result of the unique fabrication process flow of the present disclosure discussed above. For example, the patterning processes 500 (performed with the patterned mask layer 490 as an etching mask) effectively define both the locations of the isolation structures 550-551 and the locations of the source/drain contacts 600A-600C. In other words, the locations of the source/drain contacts 600A-600C are defined to be outside the isolation structures 550-551. In comparison, conventional fabrication processes may have to define the locations of the source/drain contacts in a separate process, and the resulting source/drain contacts may be formed on the upper surface of the source/drain components but not on their side surfaces.

Figure 12A:
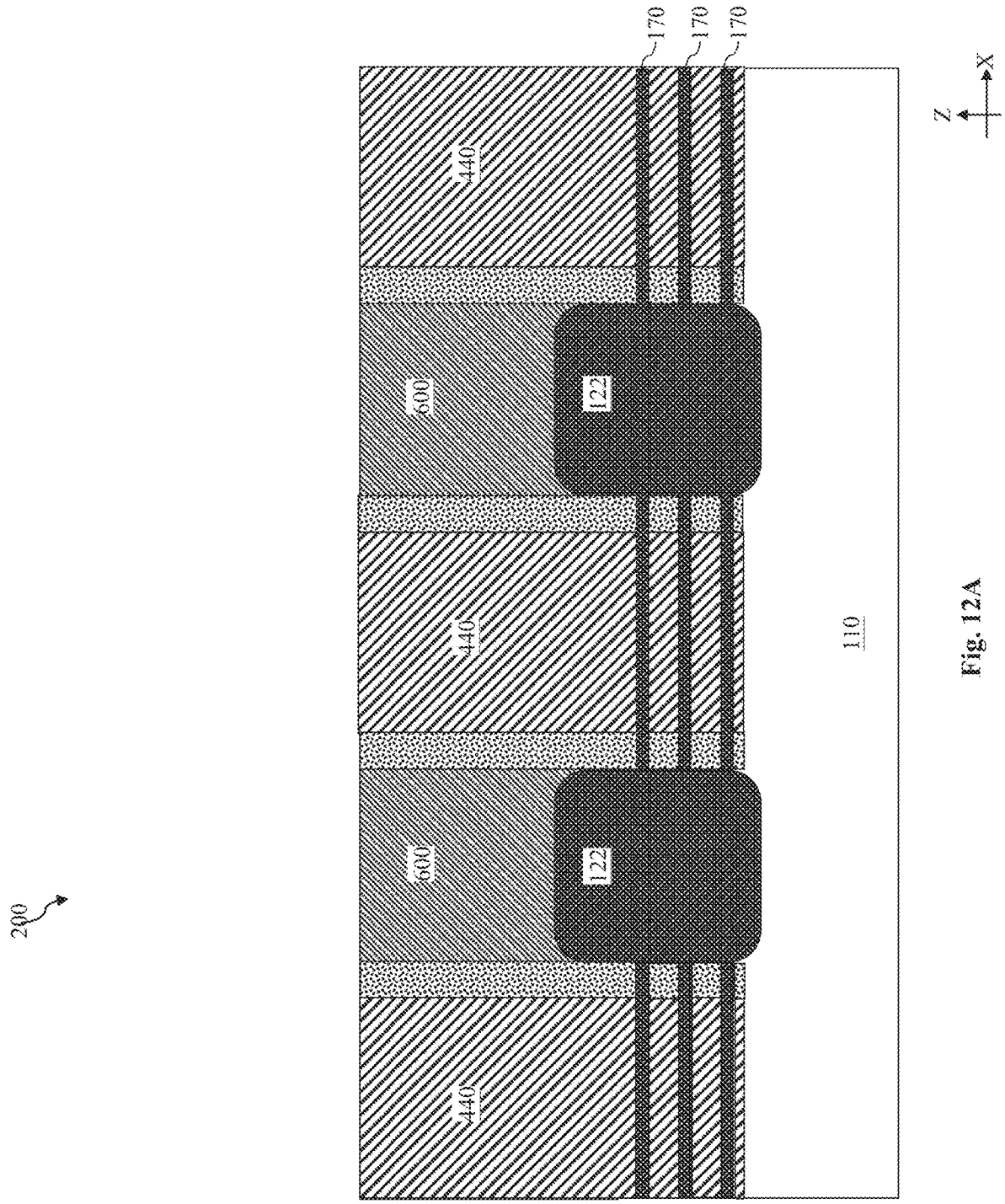
Figure 12B:
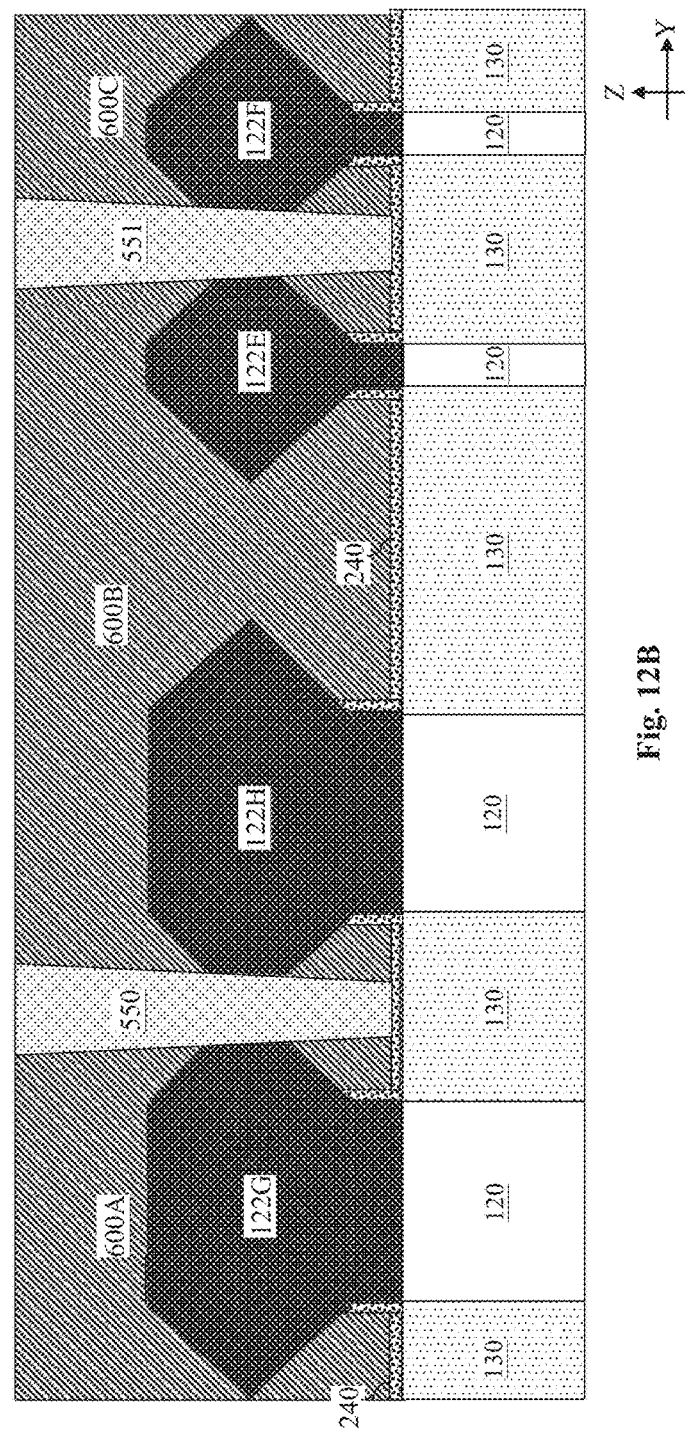

In the discussions above, the IC device 200 is in the form of a FinFET. However, the inventive concepts of the present disclosure may apply to a multi-channel device as well, such as a gate-all-around (GAA) device similar to the GAA device 150 of FIG. 1C. FIGS. 12A-12B illustrate an embodiment of the present disclosure where the IC device 200 is in the form of a GAA device. FIG. 12A illustrates an X-cut where the cross-sectional cut is taken along the cutline A-A' of FIG. 1C, and FIG. 12B illustrates an Y-cut where the cross-sectional cut is taken along the cutline B-B' of FIG. 1C. Again, for reasons of consistency and clarity, similar components appearing in FIGS. 12A-12B and in the FinFET embodiments discussed above will be labeled the same.

As shown in the X-cut view of FIG. 12A, the IC device 200 includes a plurality of nano-structures 170 as discussed above with reference to FIG. 1C. The nano-structures 170 each extend in the X-direction and may include nano-sheets, nano-tubes, nano-wires, or some other form of nano-structures. Each of the nano-structures 170 has regions that are circumferentially surrounded by the HKMG gate structures 440, where the HKMG structures 440 each include a high-k gate dielectric and a metal-containing gate electrode. These regions of the nano-structures 170 serve as the channel regions of the transistors, and thus each transistor includes multiple channels (since there are multiple nano-structures 170 per transistor).

As shown in FIG. 12B, the isolation structure 550 physically separates the source/drain components 122G and 122H of the NFETs, and the isolation structure 551 physically separates the source/drain components 122E and 122F of the PFETs. The source/drain contacts 600A is formed on the source/drain component 122G and comes into contact with the top and side surfaces of the source/drain component 122G, the source/drain contacts 600B is formed on the source/drain components 122H-122E and comes into contact with the top and side surfaces of the source/drain components 122H-122E, and the source/drain contacts 600C is formed on the source/drain component 122F and comes into contact with the top and side surfaces of the source/drain component 122F.

Figure 13:
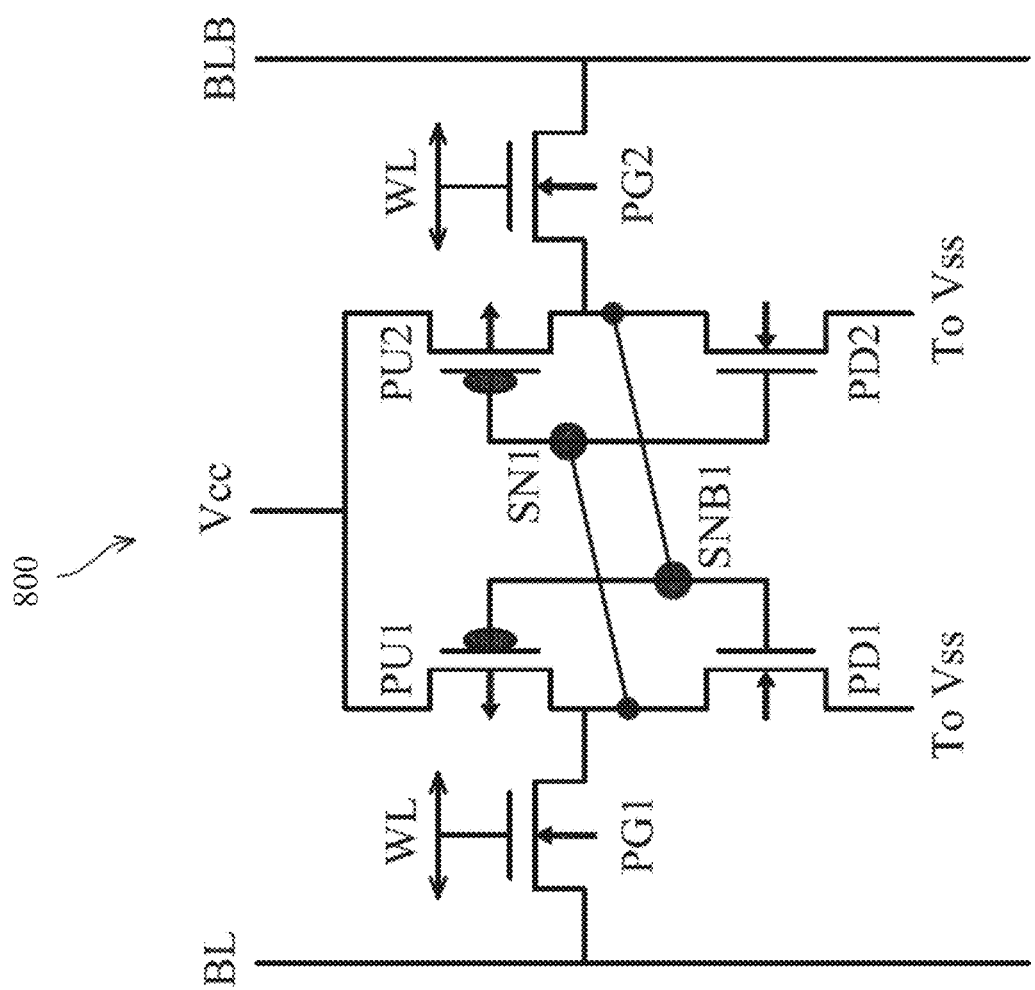
FIG. 13 is a circuit schematic of an SRAM cell according to various aspects of the present disclosure.

The IC device 200 may be implemented in a variety of IC applications, including memory devices such as Static Random-Access Memory (SRAM) devices. In that regard, FIG. 13 illustrates an example circuit schematic for a single-port SRAM cell (e.g., 1-bit SRAM cell) 800. The single-port SRAM cell 800 includes pull-up transistors PU1, PU2; pull-down transistors PD1, PD2; and pass-gate transistors PG1, PG2. As show in the circuit diagram, transistors PU1 and PU2 are p-type transistors, and transistors PG1, PG2, PD1, and PD2 are n-type transistors. According to the various aspects of the present disclosure, the PG1, PG2, PD1, and PD2 transistors are implemented with thinner spacers than the PU1 and PU2 transistors. Since the SRAM cell 800 includes six transistors in the illustrated embodiment, it may also be referred to as a 6T SRAM cell.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node SN1 and the complementary first storage node SNB1 are complementary nodes that are often at opposite logic levels (logic high or logic low). Gates of pass-gate transistors PG1 and PG2 are coupled to a word line WL. SRAM devices such as the SRAM cell 800 may be implemented using "planar" transistor devices, with FinFET devices, and/or with GAA devices.

Figure 14:
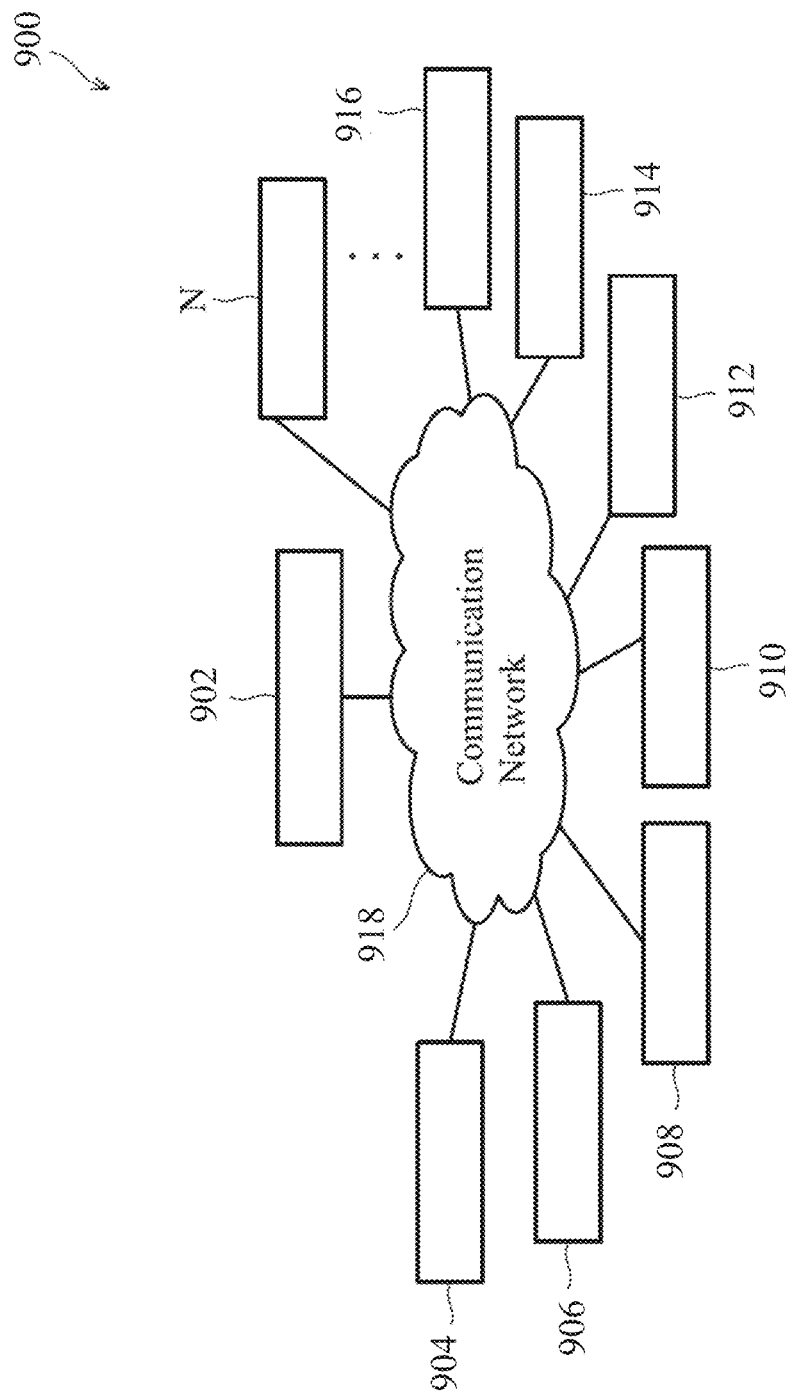
FIG. 14 is a block diagram of a manufacturing system according to various aspects of the present disclosure.

FIG. 14 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

Figure 15:
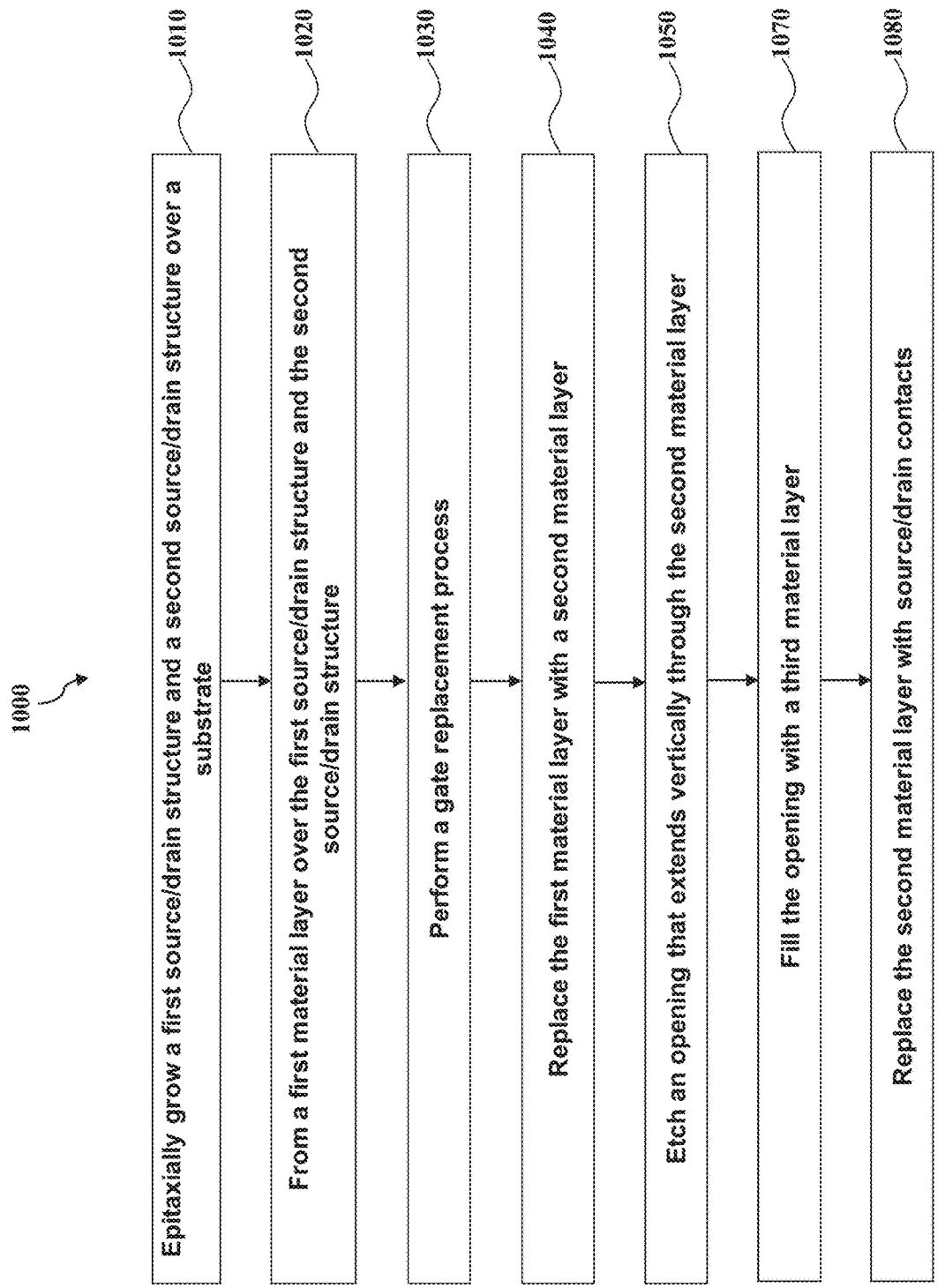
FIG. 15 is a flowchart illustrating a method of fabricating a semiconductor device according to various aspects of the present disclosure.

FIG. 15 is a flowchart illustrating a method 1000 of fabricating a semiconductor device according to embodiments of the present disclosure. The method 1000 includes a step 1010 to epitaxially grow a first source/drain structure and a second source/drain structure over a substrate. In some embodiments, the first source/drain structure and the second source/drain structure merge into each other after being epitaxially grown.

The method 1000 includes a step 1020 to form a first material layer over the first source/drain structure and the second source/drain structure.

The method 1000 includes a step 1030 to perform a gate replacement process. The gate replacement process includes one or more annealing processes with a process temperature greater than a predefined temperature threshold.

The method 1000 includes a step 1040 to replace the first material layer with a second material layer. The first material layer is more thermally stable than the second material layer. The second material layer is more patternable than the first material layer.

The method 1000 includes a step 1050 to etch an opening that extends vertically through the second material layer. The opening is formed between the first source/drain structure and the second source/drain structure. The opening completely separates the first source/drain structure from the second source/drain structure.

The method 1000 includes a step 1060 to fill the opening with a third material layer.

The method 1000 includes a step 1070 to replace the second material layer with source/drain contacts. In some embodiments, the replacing the second material layer with source/drain contacts includes depositing a conductive material on both upper surfaces and side surfaces of the first source/drain structure and the second source/drain structure.

It is understood that the method 1000 may include further steps performed before, during, or after the steps 1010-1070. For example, the method 1000 may include a step of forming an etching-stop layer on the first source/drain structure and on the second source/drain structure. The etching-stop layer and the first material layer have different material compositions. In some embodiments, the replacing the first material layer comprise performing an etching process that has an etching selectivity between the first material layer and the etching-stop layer. The method 1000 may further include a step of removing the etching-stop layer before the source/drain contacts are formed. The method 1000 may also include steps of forming dummy gate structures, forming additional metallization layers, etc. For reasons of simplicity, these additional steps are not discussed herein in detail.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

In summary, the present disclosure forms a dielectric isolation structure between epitaxially-grown source/drain components of different transistors. In some embodiments, such a dielectric isolation structure may be formed by the following processing steps: A first material layer (having a thermally stable material) is formed over the epitaxially-grown source/drain components. A gate replacement process (involving a high temperature) is then performed to form HKMG structures. Thereafter, a second material layer (having a more patternable material) is formed to replace the first material layer. A patterning process is performed to etch openings that vertically extend through the second material layer, where the openings are located between source/drain components that should be kept separate from one another. A third material layer (having a dielectric material) is formed to fill the openings. The second material layer is then removed and replaced with source/drain contacts, which are formed around the source/drain components in different directions, including on the upper surface and side surfaces of the source/drain components.

Forming such a dielectric isolation structure between certain source/drain components in the manner described in the present disclosure may offer advantages over conventional devices. However, it is understood that not all advantages are discussed herein, different embodiments may offer different advantages, and that no particular advantage is required for any embodiment. One advantage is that undesirable electrical shorting may be prevented. In more detail, as semiconductor feature sizes continue to shrink with each technology generation, the source/drain components (epitaxially grown over active regions) between adjacent transistors may merge into one another. For example, a source/drain component of a first transistor may merge into a source/drain component of a second transistor, even though the source/drain components of the first and second transistors are supposed to be kept separate physically. The merging may occur as a result of the shrinking distance between the active regions (e.g., fin structures) from which the source/drain components are grown. Thus, the margin for error may be small. When the source/drain components are grown to be larger than expected, or their locations are shifted slightly due to process variations, some of these source/drain components may merge together, even though they are meant to be kept separate. The merging source/drain components causes electrical shorting, which may degrade device performance and/or lower yield. Here, by forming the isolation structure between the source/drain components, the source/drain components that are supposed to be kept separate are indeed kept separate. In this manner, undesirable electrical shorting is prevented. Another advantage of the present disclosure is that the unique fabrication process flow enables the cut-epi process (to separate the epitaxially-grown source/drain components) and the cut-MD process (to define the location of the individual source/drain contacts) to be performed in the same processing stage simultaneously. This saves fabrication costs and reduces processing times. Other advantages may include compatibility with existing fabrication processes (including for both FinFET and GAA processes) and the ease and low cost of implementation.

One aspect of the present disclosure pertains to a device. A first source/drain structure is disposed over a substrate. A second source/drain structure is disposed over the substrate. An isolation structure is disposed between the first source/drain structure and the second source/drain structure. The first source/drain structure and a first sidewall of the isolation structure form a first interface that is substantially linear. The second source/drain structure and a second sidewall of the isolation structure form a second interface that is substantially linear. A first source/drain contact surrounds the first source/drain structure in multiple directions. A second source/drain contact surrounds the second source/drain structure in multiple directions. The isolation structure is disposed between the first source/drain contact and the second source/drain contact.

Another aspect of the present disclosure pertains to a method. A first source/drain structure and a second source/drain structure are epitaxially grown over a substrate. A first material layer is formed over the first source/drain structure and the second source/drain structure. After the first material layer is formed, a gate replacement process is performed. After the gate replacement process has been performed, the first material layer is replaced with a second material layer. An opening is etched that extends vertically through the second material layer. The opening is formed between the first source/drain structure and the second source/drain structure. The opening is filled with a third material layer. The second material layer is replaced with source/drain contacts.

Another aspect of the present disclosure pertains to a method. A dummy gate, a first source/drain, and a second source/drain are provided. The first source/drain and the second source/drain merge into each other. An etching-stop layer is formed over the first source/drain and the second source/drain. A semiconductor layer is formed over the etching-stop layer. The dummy gate is replaced with a metal-containing gate after the semiconductor layer has been formed. The semiconductor layer is etched away after the dummy gate has been replaced. The etching-stop layer prevents the first source/drain and the second source/drain from being etched away. A carbon-containing layer is formed over the first source/drain and the second source/drain after the semiconductor layer has been etched away. An opening is etched that extends through the carbon-containing layer. The opening separates the first source/drain from the second source/drain. The opening is filled with a dielectric layer. The carbon-containing layer and the etching-stop layer are removed without substantially removing the dielectric layer and the first source/drain and the second source/drain. Source/drain contacts are formed on top surfaces and side surfaces of the first source/drain and the second source/drain.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an active region;
a source/drain structure disposed over the active region in a vertical direction in a cross-sectional side view, wherein the source/drain structure includes a first outermost lateral portion facing a first lateral direction and a second outermost lateral portion facing a second lateral direction in the cross-sectional side view, and the first outermost lateral portion and the second outermost lateral portion have different shapes in the cross-sectional side view;
an isolation structure disposed directly adjacent to one of the first outermost lateral portion or the second outermost lateral portion; and
a conductive contact comprising:
a first portion positioned underlying and vertically aligned with the first outermost lateral portion; and
a second portion positioned underlying and vertically aligned with the second outermost lateral portion.

2. The semiconductor device of claim 1, wherein the conductive contact surrounds the source/drain structure, and a dimension of the conductive contact in the vertical direction exceeds a maximum dimension of the source/drain structure in the vertical direction.

3. The semiconductor device of claim 1, wherein the conductive contact is in physical contact with the first outermost lateral portion and the second outermost lateral portion.

4. The semiconductor device of claim 1, wherein:
the source/drain structure comprises a first source/drain region and a second source/drain region that are laterally merged together; and
a portion of the conductive contact is disposed between the first source/drain region and the second source/drain region.

5. The semiconductor device of claim 4, wherein:
the first source/drain region includes a first surface and a second surface disposed below the first surface;
the second source/drain region includes a third surface and a fourth surface disposed below the third surface; and
the portion of the conductive contact is in physical contact with the first surface of the first source/drain region and the third surface of the second source/drain region.

6. The semiconductor device of claim 1, wherein the second outermost lateral portion is pointier than the first outermost lateral portion.

7. The semiconductor device of claim 6, wherein the isolation structure is disposed directly adjacent to the first outermost lateral portion.

8. The semiconductor device of claim 7, wherein the isolation structure forms an interface with the first outermost lateral portion.

9. The semiconductor device of claim 8, wherein the interface is substantially linear and extends substantially in the vertical direction.

10. The semiconductor device of claim 1, further comprising a further source/drain structure disposed over the active region in the vertical direction in the cross-sectional side view, wherein:
the isolation structure is disposed between the source/drain structure and the further source/drain structure;
the further source/drain structure includes a third outermost lateral portion facing the first lateral direction and a fourth outermost lateral portion facing the second lateral direction in the cross-sectional side view; and
the third outermost lateral portion and the fourth outermost lateral portion have different shapes in the cross-sectional side view.

11. The semiconductor device of claim 10, wherein in the cross-sectional side view:
the first outermost lateral portion and the third outermost lateral portion have similar shapes; and
the second outermost lateral portion and the fourth outermost lateral portion have similar shapes.

12. The semiconductor device of claim 10, further comprising an additional source/drain structure disposed over the active region in the vertical direction in the cross-sectional side view, wherein the additional source/drain structure has a substantially smaller dimension than the source/drain structure or the further source/drain structure in the cross-sectional side view.

13. The semiconductor device of claim 1, further comprising a dielectric spacer layer disposed on surfaces of a lower portion, but not an upper portion, of the source/drain structure.

14. A semiconductor device, comprising:
an active region;
a source/drain structure disposed over the active region in a vertical direction in a cross-sectional side view, wherein the source/drain structure includes a first lateral protrusion protruding in a first lateral direction and a second lateral protrusion protruding in a second lateral direction in the cross-sectional side view, and the second lateral protrusion has a more pointed profile than the first lateral protrusion in the cross-sectional side view;

an isolation structure that forms an interface with the first lateral protrusion in the cross-sectional side view; and a source/drain contact that extends to a side surface of the isolation structure and at least the second lateral protrusion of the source/drain structure, but not to the first lateral protrusion of the source/drain structure, wherein a portion of the isolation structure that is below the interface is separated from a portion of the source/drain structure by the source/drain contact in the first lateral direction.

15. The semiconductor device of claim 14, wherein the source/drain contact extends to surfaces of the source/drain structure above and below the first lateral protrusion in the cross-sectional side view.

16. The semiconductor device of claim 14, wherein:
the source/drain structure includes a first epitaxial component and a second epitaxial component that are laterally merged together; and
a portion of the source/drain contact is trapped underneath and between the first epitaxial component and the second epitaxial component.

17. The semiconductor device of claim 16, further comprising a spacer layer disposed between the portion of the source/drain contact and the first epitaxial component and the second epitaxial component.

18. A semiconductor device, comprising:
an active region;
a first source/drain structure disposed over the active region in a vertical direction in a cross-sectional side view;
a second source/drain structure disposed over the active region in the vertical direction in the cross-sectional side view;
an isolation structure disposed between the first source/drain structure and the second source/drain structure in the cross-sectional side view, wherein:
the isolation structure defines a first substantially linear interface with the first source/drain structure and a second substantially linear interface with the second source/drain structure in the cross-sectional side view;
the first substantially linear interface extends from a topmost point where the isolation structure contacts the first source/drain structure to a bottommost point where the isolation structure contacts the first source/drain structure; and
at least one of the first source/drain structure or the second source/drain structure includes a lateral protrusion that is pointier than the first substantially linear interface and the second substantially linear interface in the cross-sectional side view; and
a first source/drain contact portion that is positioned underlying and vertically aligned with the first substantially linear interface.

19. The semiconductor device of claim 18, further comprising:
a first source/drain contact that surrounds the first source/drain structure; and
a second source/drain contact that surrounds the second source/drain structure, wherein:
a portion of the first source/drain contact is disposed below and between two different segments of the first source/drain structure; and
a portion of the second source/drain contact is disposed below and between two different segments of the second source/drain structure.

20. The semiconductor device of claim 19, further comprising a gate spacer material that is disposed between the portion of the first source/drain contact and the first source/drain structure and between the portion of the second source/drain contact and the second source/drain structure.

* * * * *